United States Patent
Nanno et al.

(10) Patent No.: US 8,980,678 B2
(45) Date of Patent: *Mar. 17, 2015

(54) METHOD FOR PRODUCING ORGANIC LIGHT-EMITTING ELEMENT, ORGANIC DISPLAY PANEL, ORGANIC LIGHT-EMITTING DEVICE, METHOD FOR FORMING FUNCTIONAL LAYER, INK, SUBSTRATE, ORGANIC LIGHT-EMITTING ELEMENT, ORGANIC DISPLAY DEVICE, AND INKJET DEVICE

(75) Inventors: Hirotaka Nanno, Kyoto (JP); Shinichiro Ishino, Osaka (JP); Tomoki Masuda, Osaka (JP); Yuko Kawanami, Osaka (JP); Noriyuki Matsusue, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/996,132

(22) PCT Filed: Jan. 19, 2011

(86) PCT No.: PCT/JP2011/000256
§ 371 (c)(1),
(2), (4) Date: Jun. 20, 2013

(87) PCT Pub. No.: WO2012/098578
PCT Pub. Date: Jul. 26, 2012

(65) Prior Publication Data
US 2013/0292667 A1 Nov. 7, 2013

(51) Int. Cl.
H01L 21/00 (2006.01)
H01L 51/56 (2006.01)
(Continued)

(52) U.S. Cl.
CPC ............ *H01L 51/56* (2013.01); *H01L 51/0005* (2013.01); *H01L 51/0007* (2013.01); *B41J 2/17* (2013.01); *H01L 51/52* (2013.01); *B41J 2/145* (2013.01); *B41J 2202/09* (2013.01)

USPC ............................................. 438/82; 257/40
(58) Field of Classification Search
CPC ..................................................... H01L 51/0005
USPC ................................................ 257/40; 438/82
See application file for complete search history.

(56) References Cited

U.S. PATENT DOCUMENTS 5,443,922 A 8/1995 Nishizaki et al.
(Continued)

FOREIGN PATENT DOCUMENTS

JP 05-163488 6/1993
(Continued)

OTHER PUBLICATIONS

U.S. Appl. No. 13/976,681 to Hirotaka Nanno et al., filed Jun. 27, 2013.
(Continued)

*Primary Examiner* — Douglas Menz
(74) *Attorney, Agent, or Firm* — Greenblum & Bernstein, P.L.C.

(57) ABSTRACT

To provide a method of efficiently manufacturing an organic light-emitting element with excellent light-emitting characteristics by application, the method includes: preparing ink and filling an inkjet device having an ink ejection nozzle with the ink; preparing a substrate having a base layer including a first electrode; and positioning the inkjet device above the substrate, and causing the inkjet device to eject a drop of the ink onto the base layer, wherein, in the preparation of the ink, a value Z denoting a reciprocal of the Ohnesorge number Oh determined by density ρ (g/m³), surface tension γ (mN·m), and viscosity η (mPa·s) of the ink and a diameter r (mm) of the ink ejection nozzle satisfies Formula 1, in the ejection of the drop of the ink, speed V (m/s) of the ejected drop satisfies Formula 2, and the value Z and the speed V (m/s) satisfy Formula 3.

26 Claims, 22 Drawing Sheets

(51) Int. Cl.
*H01L 51/00* (2006.01)
*B41J 2/17* (2006.01)
*H01L 51/52* (2006.01)
*B41J 2/145* (2006.01)

(56) References Cited

U.S. PATENT DOCUMENTS

| | | |
|---|---|---|
| 6,918,666 B2 | 7/2005 | Sekiya |
| 7,223,309 B2 | 5/2007 | Takahashi et al. |
| 7,247,339 B2 | 7/2007 | Newsome et al. |
| 7,497,541 B2 | 3/2009 | Usuda et al. |
| 7,531,377 B2 | 5/2009 | Murphy et al. |
| 7,553,375 B2 | 6/2009 | Sekiya |
| 7,932,109 B2 | 4/2011 | Hayata et al. |
| 7,989,255 B2 | 8/2011 | Murphy et al. |
| 8,435,093 B2 | 5/2013 | Takeuchi |
| 8,517,530 B2 | 8/2013 | Sekiya |
| 2004/0008243 A1 | 1/2004 | Sekiya |
| 2004/0051817 A1 | 3/2004 | Takahashi et al. |
| 2004/0135831 A1 | 7/2004 | Usuda et al. |
| 2004/0170762 A1 | 9/2004 | Newsome et al. |
| 2005/0140709 A1 | 6/2005 | Sekiya |
| 2005/0147743 A1 | 7/2005 | Sekiya |
| 2006/0154384 A1 | 7/2006 | Murphy et al. |
| 2009/0227052 A1 | 9/2009 | Murphy et al. |
| 2009/0309908 A1 | 12/2009 | Basarah et al. |
| 2010/0164360 A1 | 7/2010 | Kitamura et al. |
| 2010/0164373 A1 | 7/2010 | Kobayashi |
| 2010/0301310 A1 | 12/2010 | Noguchi et al. |
| 2012/0040478 A1 | 2/2012 | Takeuchi |
| 2012/0135660 A1 | 5/2012 | Sekiya |

FOREIGN PATENT DOCUMENTS

| | | |
|---|---|---|
| JP | 2004-031361 | 1/2004 |
| JP | 2004-055520 | 2/2004 |
| JP | 2004-148788 | 5/2004 |
| JP | 2004-335351 | 11/2004 |
| JP | 2005-056614 | 3/2005 |
| JP | 2005-537628 | 12/2005 |
| JP | 2007-126650 | 5/2007 |
| JP | 2007-273483 | 10/2007 |
| JP | 2008-108570 | 5/2008 |
| JP | 2008-135401 | 6/2008 |
| JP | 2009-123742 | 6/2009 |
| JP | 2009-267299 | 11/2009 |
| JP | 2010-107622 | 5/2010 |
| JP | 2010-157389 | 7/2010 |
| JP | 2010-253884 | 11/2010 |

OTHER PUBLICATIONS

U.S. Appl. No. 13/978,013 to Hirotaka Nanno et al., filed Jul. 2, 2013.
U.S. Appl. No. 13/978,018 to Hirotaka Nanno et al., filed Jul. 2, 2013.
International Search Report (ISR) and Written Opinion in PCT/JP2011/000256, dated Mar. 8, 2011.
International Search Report (ISR) and Written Opinion in PCT/JP2011/000266, dated Mar. 8, 2011.
International Search Report (ISR) and Written Opinion in PCT/JP2011/000252, dated Mar. 8, 2011.
International Search Report (ISR) and Written Opinion in PCT/JP2011/000255, dated Mar. 8, 2011.
United States Requirement for Restriction/Election from U.S. Patent and Trademark Office (USPTO) in U.S. Appl. No. 13/978,013, dated Sep. 4, 2014.

FIG. 3

| No. | Functional material | Weight-average molecular weight | Solvent | Concentration (wt/vol) | Viscosity $\eta$ (mPa·s) | Surface tension $\gamma$ (mN/m) | Density $\rho$ (g/m³) | Nozzle diameter r (mm) | Value Z | Ohnesorge number Oh | Placement accuracy $6\sigma$ ($\mu$m) | Judgment |
|---|---|---|---|---|---|---|---|---|---|---|---|---|
| 1 | Not included | 0 | Solvent A | 0.0 % | 12.1 | 27.3 | 827 | 0.02 | 1.8 | 0.57 | 11.3 | ○ |
| 2 | | | Solvent B | | 17.4 | 41.9 | 1190 | 0.02 | 1.8 | 0.55 | 11.8 | ○ |
| 3 | | | Solvent C | | 7.0 | 27.4 | 831 | 0.02 | 3.0 | 0.33 | 11.6 | ○ |
| 4 | | | Solvent D | | 8.3 | 28.5 | 1009 | 0.02 | 2.9 | 0.35 | 12.2 | ○ |
| 5 | | | Solvent E | | 10.5 | 41.1 | 1163 | 0.02 | 2.9 | 0.34 | 10.7 | ○ |
| 6 | | | Solvent F | | 6.5 | 35.2 | 1107 | 0.02 | 4.3 | 0.23 | 11.9 | ○ |
| 7 | | | Solvent G | | 3.8 | 27.5 | 838 | 0.02 | 5.6 | 0.18 | 11.3 | ○ |
| 8 | | | Solvent H | | 5.1 | 39.9 | 1110 | 0.02 | 5.8 | 0.17 | 11.8 | ○ |
| 9 | | | Solvent I | | 2.4 | 27.7 | 843 | 0.02 | 9.0 | 0.11 | 10.4 | ○ |
| 10 | | | Solvent J | | 2.9 | 30.9 | 1024 | 0.02 | 8.7 | 0.12 | 11.9 | ○ |
| 11 | | | Solvent K | | 2.9 | 34.6 | 940 | 0.02 | 8.7 | 0.11 | 12.4 | ○ |
| 12 | | | Solvent K | | 2.9 | 34.6 | 940 | 0.03 | 10.7 | 0.09 | 11.6 | ○ |
| 13 | F8 – F6 | 100k | Solvent K | 0.3 % | 3.8 | 33.9 | 950 | 0.02 | 6.8 | 0.15 | 11.6 | ○ |
| 14 | | | | 0.6 % | 4.9 | 33.9 | 950 | 0.02 | 5.2 | 0.19 | 11.9 | ○ |
| 15 | | | | 1.2 % | 8.3 | 33.9 | 950 | 0.02 | 3.1 | 0.33 | 11.6 | ○ |
| 16 | | | | 2.0 % | 14.3 | 33.9 | 950 | 0.02 | 1.8 | 0.56 | 11.8 | ○ |
| 17 | | | | 2.0 % | 14.3 | 33.9 | 950 | 0.03 | 2.2 | 0.46 | 11.4 | ○ |
| 18 | | | | 2.7 % | 23.8 | 33.9 | 950 | 0.02 | 1.1 | 0.94 | 12.1 | ○ |
| 19 | | | | 3.0 % | 28.0 | 33.9 | 950 | 0.02 | 0.9 | 1.10 | 12.7 | ○ |
| 20 | | | | 3.5 % | 35.0 | 33.9 | 950 | 0.02 | 0.7 | 1.38 | 15.6 | ○ |

Determination of main drop
is not possible

Satellites are generated

Determination of main drop
is not possible

Satellites are generated

I Normal ejection area

← $\eta \fallingdotseq 15$ $\eta \fallingdotseq 1$ →

I Normal ejection area

← $\eta \fallingdotseq 15$ $\eta \fallingdotseq 1$ →

II Ligament breakup/coalescence area $\eta \fallingdotseq 15$ $\eta \fallingdotseq 1 \rightarrow$ II Ligament breakup/coalescence area $\eta \fallingdotseq 15$ $\eta \fallingdotseq 1 \rightarrow$ III Satellite generation area

← η ≒ 15

η ≒ 1 →

III Satellite generation area

| No. | Functional material | Weight-average molecular weight | Solvent | Concentration (wt/vol) | Viscosity $\eta$ (mPa·s) | Surface tension $\gamma$ (mN/m) | Density $\rho$ (g/m³) | Nozzle diameter r (mm) | Value Z | Satellite generation speed (m/s) | Judgment |
|---|---|---|---|---|---|---|---|---|---|---|---|
| 22 | Not included | 0 | Solvent a | 0 % | 1.9 | 38.9 | 1030 | 0.02 | 15.0 | 2.7 | × |
| 23 | | | Solvent b | 0 % | 0.7 | 28.2 | 858 | 0.02 | 33.8 | 0.9 | × |
| 24 | | | Solvent c | 0 % | 7.0 | 27.4 | 831 | 0.02 | 3.0 | 6.2 | ○ |
| 25 | | | Solvent d | 0 % | 8.3 | 28.5 | 1009 | 0.02 | 2.9 | 6.4 | ○ |
| 26 | | | Solvent e | 0 % | 10.5 | 41.1 | 1163 | 0.02 | 2.9 | 6.5 | ○ |
| 27 | | | Solvent f | 0 % | 6.5 | 35.2 | 1107 | 0.02 | 4.3 | 5.3 | ○ |
| 28 | | | Solvent g | 0 % | 3.8 | 27.5 | 838 | 0.02 | 5.7 | 4.1 | ○ |
| 29 | | | Solvent h | 0 % | 5.1 | 39.9 | 1110 | 0.02 | 5.8 | 4.5 | ○ |
| 30 | | | Solvent i | 0 % | 2.8 | 39.2 | 1065 | 0.02 | 10.5 | 3.2 | ○ |
| 31 | | | Solvent j | 0 % | 2.9 | 30.9 | 1024 | 0.02 | 8.8 | 3.4 | ○ |
| 32 | | | Solvent k | 0 % | 0.9 | 28.4 | 907 | 0.02 | 25.0 | 1.4 | × |
| 33 | | | Solvent l | 0 % | 1.2 | 33.3 | 970 | 0.02 | 21.0 | 2.0 | × |
| 34 | | | Solvent l | 0 % | 1.2 | 33.3 | 970 | 0.03 | 25.7 | 1.7 | × |
| 35 | | | Solvent m | 0 % | 2.9 | 34.6 | 940 | 0.02 | 8.7 | 3.7 | ○ |
| 36 | | | Solvent m | 0 % | 2.9 | 34.6 | 940 | 0.03 | 10.7 | 3.3 | ○ |
| 37 | F8 – F6 | 100k | Solvent m | 0.2 % | 3.4 | 33.9 | 958 | 0.02 | 7.5 | 4.0 | ○ |
| 38 | | | | 0.3 % | 3.8 | 33.9 | 958 | 0.02 | 6.8 | 4.2 | ○ |
| 39 | | | | 0.6 % | 4.9 | 33.9 | 958 | 0.02 | 5.3 | 5.1 | ○ |
| 40 | | | | 1.2 % | 8.3 | 33.9 | 958 | 0.02 | 3.1 | 6.0 | ○ |

FIG. 15

| Weight-average molecular weight | Value Z | | | | | | |
|---|---|---|---|---|---|---|---|
| | 0.9 | 1.0 | 1.5 | 3 | 5 | 7 | 8.8 |
| 100k | 3.00 % (30) | 2.67 % (24) | 1.95 % (14) | 1.17 % (8.3) | 0.60 % (4.9) | 0.30 % (3.8) | |
| 250k | | 1.62 % (30) | 1.11 % (16) | 0.55 % (7.0) | 0.30 % (4.9) | 0.15 % (3.7) | 0.00 % (2.9) |
| 400k | | 1.14 % (32) | 0.79 % (17) | 0.40 % (7.7) | 0.20 % (4.7) | 0.10 % (3.6) | |

Upper tier: concentration (wt/vol)
Lower tier: viscosity $\eta$ (mPa·s)

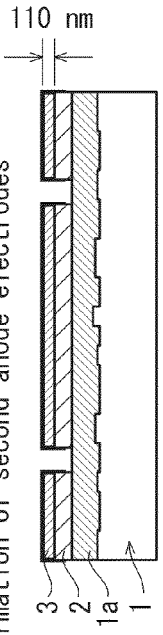
FIG. 18A Preparation of substrate
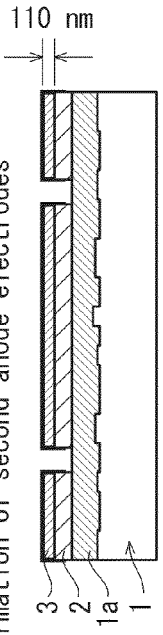
FIG. 18B Development (removal of protective resist)
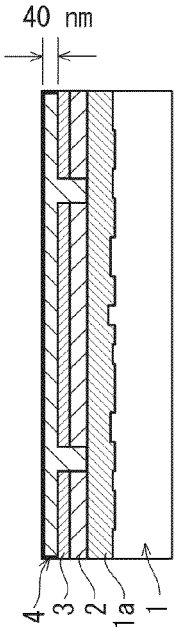
FIG. 18C Formation of planarizing film
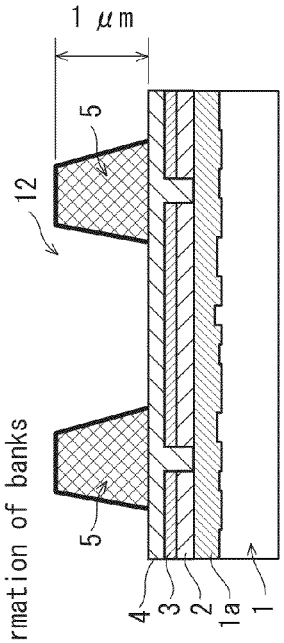
FIG. 18D Formation of first anode electrodes
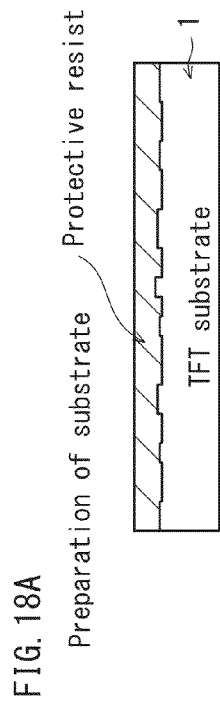
FIG. 18E Formation of second anode electrodes
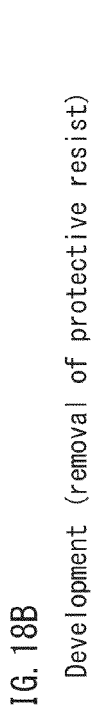
FIG. 18F Formation of hole injection layer
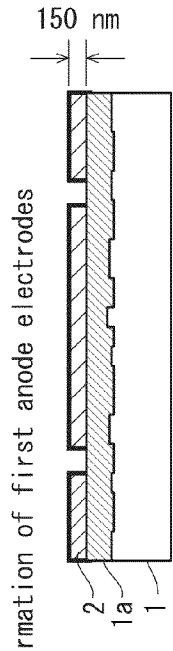
FIG. 18G Formation of banks

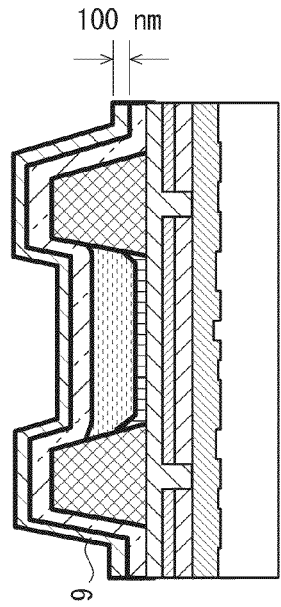
FIG. 19D Formation of cathode electrode
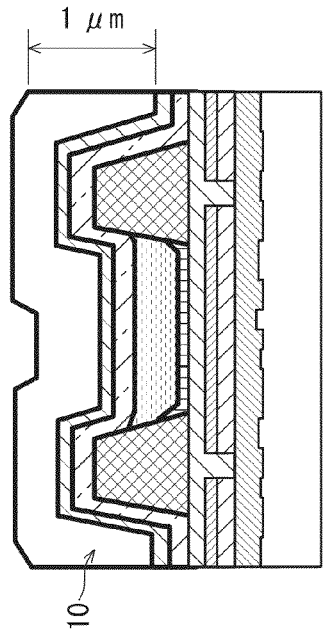
FIG. 19E Formation of passivation layer
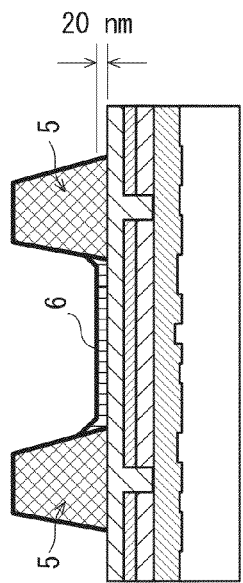
FIG. 19A Formation of hole transport layer
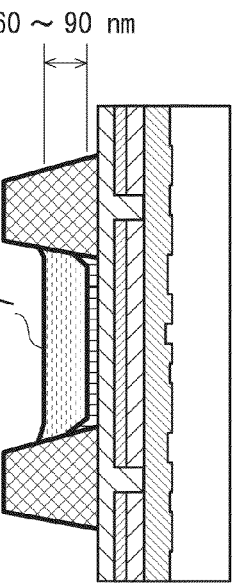
FIG. 19B Formation of light-emitting layer
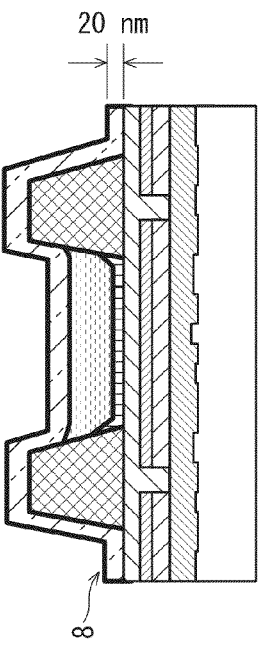
FIG. 19C Formation of electron transport layer

METHOD FOR PRODUCING ORGANIC LIGHT-EMITTING ELEMENT, ORGANIC DISPLAY PANEL, ORGANIC LIGHT-EMITTING DEVICE, METHOD FOR FORMING FUNCTIONAL LAYER, INK, SUBSTRATE, ORGANIC LIGHT-EMITTING ELEMENT, ORGANIC DISPLAY DEVICE, AND INKJET DEVICE

TECHNICAL FIELD

The present invention relates to a method of manufacturing an organic light-emitting element, an organic display panel, an organic light-emitting device, a method of forming a functional layer, ink, a substrate, an organic light-emitting element, an organic display device, and an inkjet device.

BACKGROUND ART

Organic light-emitting elements, which have recently been studied and developed, are light-emitting elements making use of the phenomenon of electroluminescence occurring in functional material and have a structure in which an organic light-emitting layer formed from functional material is interposed between an anode and a cathode. In a process of manufacturing such organic light-emitting elements, functional material is deposited on a substrate by a vapor deposition method using a mask to form a functional layer including an organic light-emitting layer.

As an alternative to the vapor deposition method, an application method has been proposed (Patent Literature 1). In the application method, the functional material is dissolved in a solvent to form ink, the ink is applied to a substrate by ejecting the ink from an ink ejection nozzle of an inkjet device, and then the solvent is volatilized to form an organic light-emitting layer. In this method, there is no need to perform the process in a vacuum chamber and to use the mask. This method is thus preferred in terms of mass production.

CITATION LIST

Patent Literature

[Patent Literature 1]
Japanese Patent Application Publication No. 2009-267299

SUMMARY OF INVENTION

Technical Problem

In order to manufacture an organic light-emitting element with excellent light-emitting characteristics by the application method, it is necessary to form an organic light-emitting layer having a uniform film thickness and shape by applying ink exactly to a light-emitting layer-forming region on the substrate. To this end, ink drops ejected from the inkjet device have to have preferred flight characteristics. That is to say, the ink drops have to arrive straight at a desired destination without breaking up.

The flight characteristics of ink drops, however, are variable depending on the properties of ink, such as the density, the surface tension, the viscosity, and a droplet diameter of the ink. It is not easy to control the flight characteristics, because correlations among these properties are unclear. The flight characteristics also vary depending on factors other than the properties of the ink, such as the droplet diameter of the ink, which is determined primarily by a diameter of the ink ejection nozzle, and speed at which ink drops are ejected from the ink ejection nozzle. This makes it more difficult to control the flight characteristics.

It is a fact that, each time ink or an inkjet head is replaced with a new one, the flight characteristics are evaluated by actually ejecting the ink by using the new ink or inkjet head while making modifications to various factors affecting the flight characteristics, to seek a condition providing preferred flight characteristics. It takes a long time to determine the condition. To address the above-mentioned problem, it is necessary to develop technology to estimate the condition providing preferred flight characteristics with ease and accuracy.

In view of the above-mentioned problem, the primary objective of the present invention is to provide a method of efficiently manufacturing an organic light-emitting element with excellent light-emitting characteristics by an application method, through easy and accurate estimation of the condition providing preferred flight characteristics.

Solution to Problem

To achieve the above-mentioned objective, a method of manufacturing an organic light-emitting element pertaining to one aspect of the present invention includes: preparing ink including functional material as a material for a functional layer and a solvent dissolving the functional material, and filling an inkjet device having an ink ejection nozzle with the ink, the functional material having a weight-average molecular weight greater than zero and equal to or less than 100,000; preparing a substrate having a base layer including a first electrode; positioning the inkjet device above the substrate, and causing the inkjet device to eject a drop of the ink onto the base layer of the substrate; forming the functional layer by drying the ink ejected onto the base layer of the substrate; and forming a second electrode above the functional layer, wherein, in the preparation of the ink, when a value Z denotes a reciprocal of the Ohnesorge number Oh determined by density $\rho$ (g/m³), surface tension $\gamma$ (mN·m), and viscosity $\eta$ (mPa·s) of the ink and a diameter r (mm) of the ink ejection nozzle, the value Z is within a range of Formula 1, in the ejection of the drop of the ink, speed V (m/s) of the ejected drop of the ink is within a range of Formula 2, and the value Z and the speed V (m/s) satisfy Formula 3.

$0.7 \leq Z \leq 13$ where $Z = 1/\text{Ohnesorge number } Oh = (r \cdot \rho \cdot \gamma)^{1/2}/\eta$      (Formula 1);

$3 \leq V \leq 6$      (Formula 2); and $V \leq -2.17 \, \text{Ln}(Z) + 8.47$      (Formula 3).

Advantageous Effects of Invention

In the method of manufacturing the organic light-emitting element pertaining to one aspect of the present invention, when the value Z denotes the reciprocal of the Ohnesorge number Oh determined by the density $\rho$ (g/m³), the surface tension $\gamma$ (mN·m), and the viscosity $\eta$ (mPa·s) of the ink and the diameter r (mm) of the ink ejection nozzle, the value Z is within the range of Formula 1 shown above, the speed V (m/s) of the ejected drop of the ink is within the range of Formula 2 shown above, and the value Z and the speed V (m/s) satisfy Formula 3 shown above. Since only two variables, i.e. the value Z and the speed V (m/s), are used, it is easy to estimate a variation of the flight characteristics. Furthermore, since there are high correlations between the value Z and the flight characteristics and between the speed V (m/s) and the flight characteristics, accurate estimation is possible. Therefore, the condition providing preferred flight characteristics can be estimated with ease and accuracy. As a result, the organic light-emitting element with excellent light-emitting characteristics can efficiently be manufactured by the application method.

BRIEF DESCRIPTION OF DRAWINGS

FIG. 3 shows experimental results on a relation between a value Z and the placement accuracy.

FIG. 12 shows experimental results on the relation between the value Z and the satellite generation speed.

FIG. 15 shows a relation among the value Z, concentration of ink, and viscosity η of the ink.

FIGS. 18A to 18G are a process chart showing a method of manufacturing an organic light-emitting element pertaining to one aspect of the present invention.

FIGS. 19A to 19E are a process chart showing the method of manufacturing the organic light-emitting element pertaining to one aspect of the present invention.

FIG. 20 is a perspective view illustrating an organic display device pertaining to one aspect of the present invention and the like.

DESCRIPTION OF EMBODIMENTS

Figure 1:
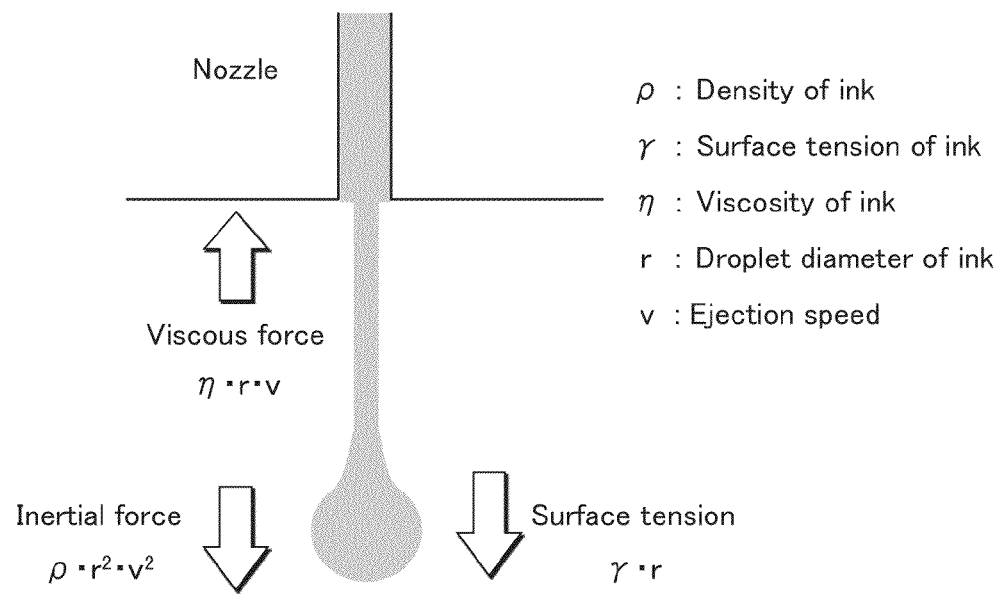
FIG. 1 illustrates three forces affecting flight characteristics of an ink drop.

The following describes a method of manufacturing an organic light-emitting element, an organic display panel, an organic light-emitting device, a method of forming a functional layer, ink, a substrate, an organic light-emitting element, an organic display device, and an inkjet device pertaining to one aspect of the present invention, with reference to the drawings.

[Overview of One Aspect of Present Invention]

A method of manufacturing an organic light-emitting element pertaining to one aspect of the present invention includes: preparing ink including functional material as a material for a functional layer and a solvent dissolving the functional material, and filling an inkjet device having an ink ejection nozzle with the ink, the functional material having a weight-average molecular weight greater than zero and equal to or less than 100,000; preparing a substrate having a base layer including a first electrode; positioning the inkjet device above the substrate, and causing the inkjet device to eject a drop of the ink onto the base layer of the substrate; forming the functional layer by drying the ink ejected onto the base layer of the substrate; and forming a second electrode above the functional layer, wherein, in the preparation of the ink, when a value Z denotes a reciprocal of the Ohnesorge number Oh determined by density $\rho$ (g/m$^3$), surface tension $\gamma$ (mN·m), and viscosity $\eta$ (mPa·s) of the ink and a diameter r (mm) of the ink ejection nozzle, the value Z is within a range of the above-mentioned Formula 1, in the ejection of the drop of the ink, speed V (m/s) of the ejected drop of the ink is within a range of the above-mentioned Formula 2, and the value Z and the speed V (m/s) satisfy the above-mentioned Formula 3.

In a particular aspect of the method of manufacturing the organic light-emitting element pertaining to one aspect of the present invention, the value Z is two or more and is ten or less, and the speed V is 3 m/s or more and is 5 m/s or less.

In a particular aspect of the method of manufacturing the organic light-emitting element pertaining to one aspect of the present invention, the density $\rho$ of the ink is more than 827 g/m$^3$ and is 1190 g/m$^3$ or less, the surface tension $\gamma$ of the ink is more than 27.3 mN·m and is 41.9 mN·m or less, the viscosity $\eta$ of the ink is more than 2.4 mPa·s and is 35.0 mPa·s or less, and the diameter r of the ink ejection nozzle is 0.02 mm or more and is 0.03 mm or less.

In a particular aspect of the method of manufacturing the organic light-emitting element pertaining to one aspect of the present invention, in the preparation of the substrate, the substrate has a plurality of openings corresponding to respective pixel units and includes a plurality of banks each formed above the base layer to partition adjacent pixel units, and, in the ejection of the drop of the ink, drops of the ink are ejected onto the base layer in regions corresponding to the openings between the banks.

An organic display panel pertaining to one aspect of the present invention utilizes the organic light-emitting element manufactured by the above-mentioned method.

An organic light-emitting device pertaining to one aspect of the present invention utilizes the organic light-emitting element manufactured by the above-mentioned method.

An organic display device pertaining to one aspect of the present invention utilizes the organic light-emitting element manufactured by the above-mentioned method.

A method of forming a functional layer pertaining to one aspect of the present invention includes: preparing ink including functional material as a material for the functional layer and a solvent dissolving the functional material, and filling an inkjet device having an ink ejection nozzle with the ink, the functional material having a weight-average molecular weight greater than zero and equal to or less than 100,000; preparing a substrate on which the functional layer is to be formed; positioning the inkjet device above the substrate, and causing the inkjet device to eject a drop of the ink onto the substrate; and forming the functional layer by drying the ink ejected onto the substrate; and, wherein, in the preparation of the ink, when a value Z denotes a reciprocal of the Ohnesorge number Oh determined by density ρ (g/m³), surface tension γ (mN·m), and viscosity η (mPa·s) of the ink and a diameter r (mm) of the ink ejection nozzle, the value Z is within a range of the above-mentioned Formula 1, in the ejection of the drop of the ink, speed V (m/s) of the ejected drop of the ink is within a range of the above-mentioned Formula 2, and the value Z and the speed V (m/s) satisfy the above-mentioned Formula 3.

In a particular aspect of the method of forming the functional layer pertaining to one aspect of the present invention, the value Z is two or more and is ten or less, and the speed V is 3 m/s or more and is 5 m/s or less.

In a particular aspect of the method of forming the functional layer pertaining to one aspect of the present invention, the density ρ of the ink is more than 827 g/m³ and is 1190 g/m³ or less, the surface tension γ of the ink is more than 27.3 mN·m and is 41.9 mN·m or less, the viscosity η of the ink is more than 2.4 mPa·s and is 35.0 mPa·s or less, and the diameter r of the ink ejection nozzle is 0.02 mm or more and is 0.03 mm or less.

An ink pertaining to one aspect of the present invention is ejected onto a substrate by an inkjet device having an ink ejection nozzle, is dried to form a functional layer, and includes: functional material as a material for the functional layer, the functional material having a weight-average molecular weight greater than zero and equal to or less than 100,000; and a solvent dissolving the functional material, wherein, when a value Z denotes a reciprocal of the Ohnesorge number Oh determined by density ρ (g/m³), surface tension γ (mN·m), and viscosity η (mPa·s) of the ink and a diameter r (mm) of the ink ejection nozzle, the value Z is within a range of the above-mentioned Formula 1, speed V (m/s) at which the ink is ejected is within a range of the above-mentioned Formula 2, and the value Z and the speed V (m/s) satisfy the above-mentioned Formula 3.

In a particular aspect of the ink pertaining to one aspect of the present invention, the ink includes the solvent and the functional material as a material for the functional layer of an organic light-emitting element; and is ejected onto a base layer of the substrate for the organic light-emitting element and dried to form the functional layer between a first electrode included in the base layer and a second electrode opposing the base layer.

In a particular aspect of the ink pertaining to one aspect of the present invention, when the speed V is 3 m/s or more and is 5 m/s or less, the value Z, which is determined by the density ρ (g/m³), the surface tension γ (mN·m), and the viscosity η (mPa·s) of the ink, is two or more and is ten or less.

In a particular aspect of the ink pertaining to one aspect of the present invention, when the diameter r of the ink ejection nozzle is 0.02 mm or more and is 0.03 mm or less, the density ρ of the ink is more than 827 g/m³ and is 1190 g/m³ or less, the surface tension γ of the ink is more than 27.3 mN·m and is 41.9 mN·m or less, and the viscosity η of the ink is more than 2.4 mPa·s and is 35.0 mPa·s or less.

A substrate pertaining to one aspect of the present invention has the functional layer manufactured by using the above-mentioned ink.

An organic light-emitting element pertaining to one aspect of the present invention has the functional layer manufactured by using the above-mentioned ink.

An organic display panel pertaining to one aspect of the present invention includes the organic light-emitting element having the functional layer manufactured by using the above-mentioned ink.

An organic light-emitting device pertaining to one aspect of the present invention includes the organic light-emitting element having the functional layer manufactured by using the above-mentioned ink.

An organic display device pertaining to one aspect of the present invention includes the organic light-emitting element having the functional layer manufactured by using the above-mentioned ink.

An inkjet device pertaining to one aspect of the present invention is for containing therein ink including functional material as a material for a functional layer and a solvent dissolving the functional material, and ejects the ink from an ink ejection nozzle onto a substrate to form the functional layer, the functional material having a weight-average molecular weight greater than zero and equal to or less than 100,000, wherein, when a value Z denotes a reciprocal of the Ohnesorge number Oh determined by density ρ (g/m³), surface tension γ (mN·m), and viscosity η (mPa·s) of the ink and a diameter r (mm) of the ink ejection nozzle, the value Z is within a range of the above-mentioned Formula 1, speed V (m/s) at which the ink is ejected is within a range of the above-mentioned Formula 2, and the value Z and the speed V (m/s) satisfy the above-mentioned Formula 3.

In a particular aspect of the inkjet device pertaining to one aspect of the present invention, the functional material included in the ink is a material for the functional layer of an organic light-emitting element, and the ink is ejected onto a base layer of the substrate for the organic light-emitting element to form the functional layer between a first electrode included in the base layer and a second electrode opposing the base layer.

The substrate pertaining to one aspect of the present invention has the functional layer manufactured by using the above-mentioned inkjet device.

The organic light-emitting element pertaining to one aspect of the present invention has the functional layer manufactured by using the above-mentioned inkjet device.

The organic display panel pertaining to one aspect of the present invention includes the organic light-emitting element having the functional layer manufactured by using the above-mentioned inkjet device.

The organic light-emitting device pertaining to one aspect of the present invention includes the organic light-emitting element having the functional layer manufactured by using the above-mentioned inkjet device.

The organic display device pertaining to one aspect of the present invention includes the organic light-emitting element having the functional layer manufactured by using the above-mentioned inkjet device.

[Background Leading to Present Invention]

The inventors have perfected technology to estimate a condition providing preferred flight characteristics with ease and accuracy through experiments and considerations described below.

(Considerations of Variables Used to Control Flight Characteristics)

In considering variables used to control the flight characteristics to estimate the condition providing preferred flight characteristics with ease and accuracy, the inventors focused on three physical forces (viscous resistance, inertial force, and surface tension) affecting behavior of ink.

FIG. 1 illustrates the three forces affecting the flight characteristics of an ink drop. As illustrated in FIG. 1, the flight characteristics of the ink drop are determined by a balance among the three forces, that is, the viscous resistance, the inertial force, and the surface tension.

As shown in the following Equation 1, the viscous resistance is determined by the viscosity $\eta$ and a droplet diameter r' of the ink, and speed V at which the ink is ejected.

Viscous force=$\eta \cdot r \cdot v$ (Equation 1)

As shown in the following Equation 2, the inertial force is determined by the density $\rho$ and the droplet diameter r' of the ink, and the ejection speed V.

Inertial force=$\rho \cdot r^2 \cdot v^2$ (Equation 2)

As shown in the following Equation 3, the surface tension is determined by the surface tension $\gamma$ and the droplet diameter r' of the ink.

Surface tension=$\gamma \cdot r$ (Equation 3)

Taken together, there are five factors affecting the flight characteristics of the ink drop, i.e. the density $\rho$, the surface tension $\gamma$, the viscosity $\eta$, and the droplet diameter r' of the ink, and the ejection speed V. Of these five factors, four factors, that is, the density $\rho$, the surface tension $\gamma$, the viscosity $\eta$, and the droplet diameter r' of the ink are factors relating to the properties of the ink, and only the ejection speed V is a factor other than the factors relating to the properties of the ink. When each of these factors is considered as a variable, the number of variables is as many as five. To make matters worse, correlations among these factors are unclear, and this makes it extremely difficult to control the flight characteristics.

In order to facilitate control over the flight characteristics, the inventors attempted to reduce the number of variables, and, to this end, focused on the Reynolds number Nre, the Weber number Nwe, and the Ohnesorge number Oh.

The Reynolds number Nre is a dimensionless number defined as the ratio of the inertial force to the viscous force, and is utilized to quantify "flow" in fluid mechanics. In the present application, the Reynolds number Nre is considered to be associated primarily with the straightness of an ink drop. As shown in the following Equation 4, the Reynolds number Nre is expressed as the ratio of the inertial force to the viscous force.

Reynolds number Nre=inertial force/viscous force=$v \cdot r \cdot \rho / \eta$ (Equation 4)

The Weber number Nwe is a dimensionless number that is of importance in treating two-phase flow, and is utilized to analyze deformation behavior when drops flow through the air and a problem of interfacial stability of drops. In the present application, the Weber number Nwe is considered to be associated primarily with breakup characteristics of an ink drop. As shown in the following Equation 5, the Weber number Nwe is expressed as the ratio of the inertial force to the surface tension.

Weber number Nwe=inertial force/surface tension=$v^2 \cdot r \cdot \rho / \gamma$ (Equation 5)

The Ohnesorge number Oh is a dimensionless number showing a relation among the viscous force, the inertial force, and the surface tension. As shown in the following Equation 6, the Ohnesorge number Oh is expressed as the ratio of the Reynolds number Nre to the Weber number Nwe.

Ohnesorge number $Oh=$(Weber number $Nwe)^{1/2}$/Reynolds number $Nre$ (Equation 6)

By substituting the above-mentioned Equation 4 and Equation 5 into the above-mentioned Equation 6, the balance among the three forces, i.e. the viscous resistance, the inertial force, and the surface tension, can be expressed by using only four factors relating to the properties of the ink, i.e. the density $\rho$, the surface tension $\gamma$, the viscosity $\eta$, and the droplet diameter r' of the ink, as shown in the following Equation 7, and the factor other than the factors relating to the properties of the ink, i.e. the ejection speed V, can be eliminated. Furthermore, the four factors relating to the properties of the ink can collectively be expressed by a value Z denoting a reciprocal of the Ohnesorge number Oh.

$$Z = 1/\text{Ohnesorge number } Oh \quad \text{(Equation 7)}$$
$$= \text{Reynolds number } Nre/(\text{Weber Number } Nwe)^{1/2}$$
$$= \left(\frac{\text{inertial force}}{\text{viscous force}}\right) / \left(\frac{\text{inertial force}}{\text{surface tension}}\right)^{1/2}$$
$$= (v \cdot r \cdot \rho / \eta) / (v^2 \cdot r \cdot \rho / \gamma)^{1/2}$$
$$= (r \cdot \rho \cdot \gamma)^{1/2} / \eta$$

As described above, by classifying the factors affecting the flight characteristics into the factor relating to the properties of the ink and the factor other than the factor relating to the properties of the ink, and treating the value Z collectively expressing the factors relating to the properties of the ink as a single variable, the control over the flight characteristics is facilitated.

By the above-mentioned considerations, the inventors conceived the idea of controlling the flight characteristics by using two variables, i.e. the value Z, which expresses the factors relating to the properties of the ink, and the ejection speed V, which is the factor other than the factor relating to the properties of the ink. In order to confirm correlations between the value Z and the flight characteristics and between the ejection speed V and the flight characteristics, the inventors conducted experiments. The inventors assumed that, since the value Z and the ejection speed V are independent of each other, the correlations between the value Z and the flight characteristics and between the ejection speed V and the flight characteristics are identified independently.

(Correlation Between Value Z and Straightness of Ink Drop)

In order to provide preferred flight characteristics, an ink drop has to have preferred straightness. The preferred straightness refers to a state where an ink drop ejected from the inkjet device arrives straight at a desired destination. The straightness can be evaluated, for example, by measuring ink drop placement accuracy.

Figure 2:
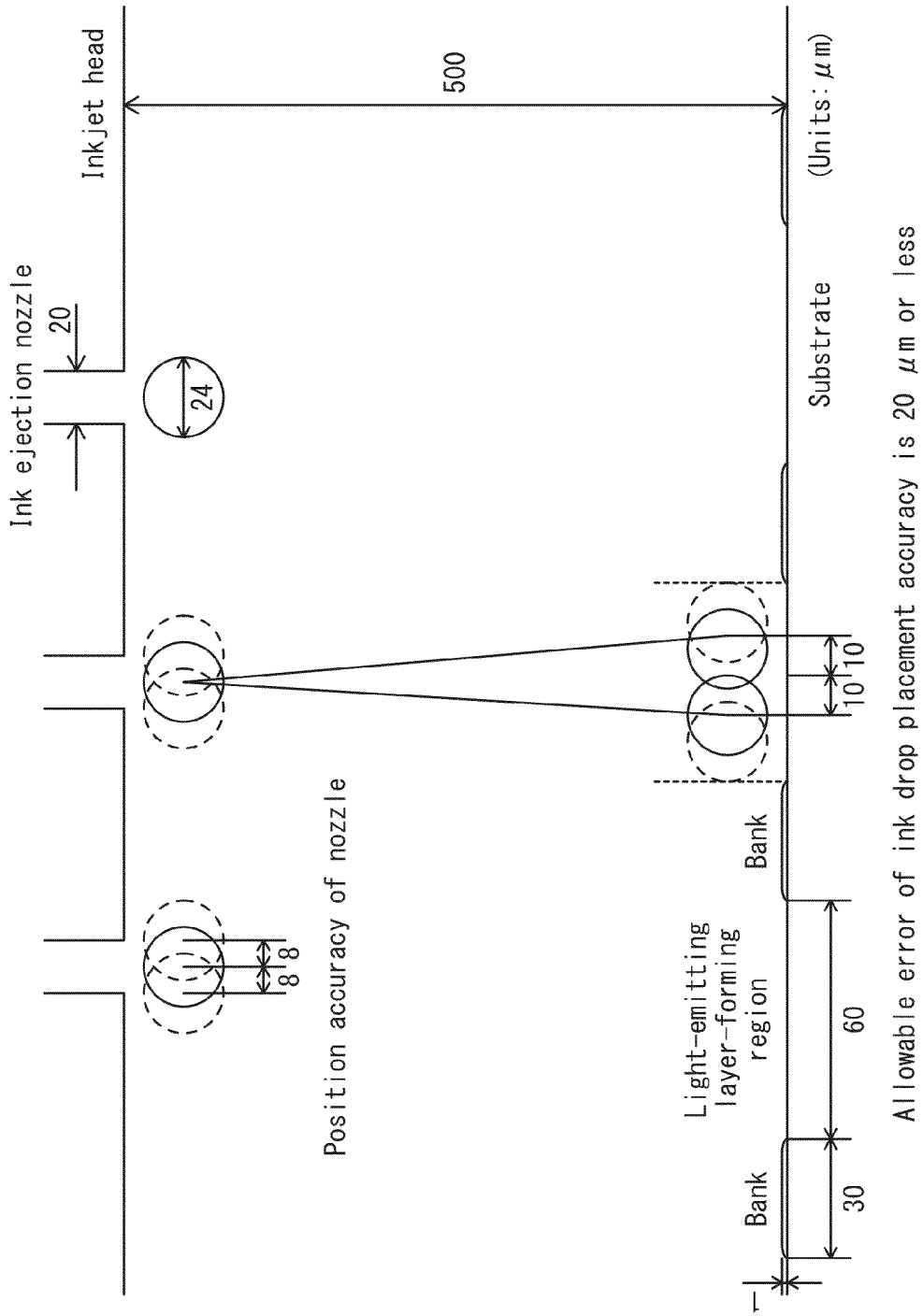
FIG. 2 illustrates ink drop placement accuracy.

FIG. 2 illustrates the ink drop placement accuracy. The ink drop placement accuracy is described below with use of FIG. 2.

When ink is applied by the application method using an inkjet device, an inkjet head is typically positioned above a substrate, and an ink drop is ejected downward from an ink ejection nozzle. In this case, a distance between the substrate and the inkjet head is approximately 500 μm, for example.

The substrate includes, on the top surface thereof, a plurality of banks (partition walls) for partitioning light-emitting layer-forming regions (pixel units). For example, the width of each light-emitting layer-forming region is approximately 60 μm, and the width and the thickness of each bank are approximately 30 μm and 1 μm, respectively. On the other hand, a diameter r of the ink ejection nozzle is approximately 20 μm, and the droplet diameter r' of the ink ejected from the ink ejection nozzle is approximately 24 μm. An error limit of the position accuracy of the ink ejection nozzle is approximately ±8 μm. It is therefore preferable to eject an ink drop with an error of ±10 μm or less, in order to eject the entire ink drop in the light-emitting layer-forming region. In view of this, when the error is ±10 μm or less, i.e. an error of the placement accuracy is 20 μm or less, the ink drop is determined to have preferred straightness.

FIG. 3 shows experimental results on a relation between the value Z and the placement accuracy. The value Z was controlled by changing functional material and a solvent included in ink, the concentration (the concentration of the functional material in the ink), the viscosity η, the surface tension γ, and the density ρ of the ink, and the diameter r of the ink ejection nozzle. Ink drops were ejected on the condition described with use of FIG. 2, and then the ink drop placement accuracy was measured and evaluated by using standard deviation 6σ. The droplet diameter r' of the ink depends on the diameter r of the ink ejection nozzle, and thus the diameter r is used instead of using the droplet diameter r' of the ink.

In order to evaluate ink including functional material having a weight-average molecular weight greater than zero and equal to or less than 100,000 (abbreviated as "100 k" in the figures of the present application), the experiments were conducted by using ink including functional material having a weight-average molecular weight of 100,000. The experiments were also conducted by using, as an alternative to ink including functional material having a weight-average molecular weight that is as close to zero as possible, ink including functional material having a weight-average molecular weight of zero, i.e. ink not including functional material (a solvent alone).

In the column of "solvent" in FIG. 3, solvents A, B, C, D, E, F, G, H, I, J, and K respectively indicate 1-nonanol, dimethyl phthalate, xylene/1-nonanol=14/86, dimethyl phthalate/1-nonanol=50/50, acetophenone/dimethyl phthalate=17/83, xylene/dimethyl phthalate=25/75, xylene/1-nonanol=35/65, acetophenone/dimethyl phthalate=50/50, xylene/1-nonanol=50/50, xylene/dimethyl phthalate=50/50, and cyclohexylbenzene.

For example, on the condition shown as No. 1, an error of the placement accuracy is 11.3 μm, which is within 20 μm. In this case, the results of the judgment are indicated by a circle (○), which indicates that the preferred straightness can be obtained. On each of the other conditions, an error of the placement accuracy is 20 μm or less. In this case, the results of the judgment are indicated by a circle (○), which indicates that the preferred straightness can be obtained.

Figure 4:
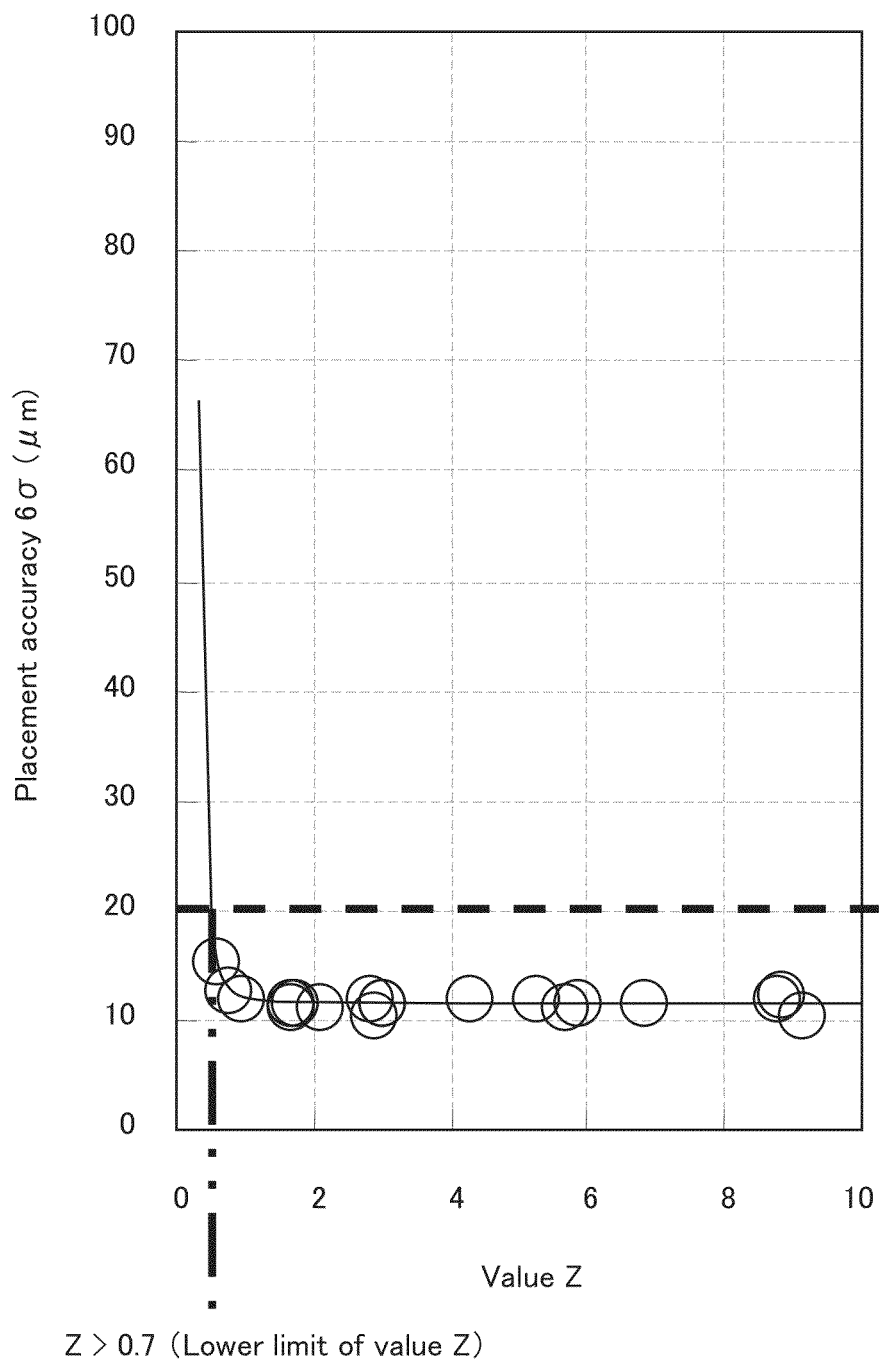
FIG. 4 shows the relation between the value Z and the placement accuracy.

FIG. 4 shows the relation between the value Z and the placement accuracy. When the experimental results No. 1 to No. 20 shown in FIG. 3 are plotted in the X and Y coordinates showing the value Z on the X axis and showing the placement accuracy on the Y axis as shown in FIG. 4, it is found that there is a correlation between the value Z and a satellite generation speed. It is also found that the placement accuracy is degraded as the value Z decreases, and, when the value Z is less than 0.7, an error of the placement accuracy exceeds 20 μm. In view of this, a lower limit of the value Z is determined as 0.7. Furthermore, as is apparent from a slope of an approximate curve shown in FIG. 4, it is considered desirable that the value Z be two or more in terms of the stability of the preferred placement accuracy.

It was found that one of the causes of the degradation of the placement accuracy is an increase in the ligament length when the value Z is small and the viscosity of the ink is high, because an ink drop is less likely to break off from the ink ejection nozzle in such a case. It was also found that the preferred placement accuracy was obtained when the viscosity η of the ink is low, because the ink drop is more likely to break off and thus the ligament is short in such a case.

(Correlation between Ejection Speed V and Straightness of Ink Drop)

The correlation between the ejection speed V and the flight characteristics was examined by investigating the relation between the ejection speed V and the straightness of an ink drop (placement accuracy). Ink used for measurement includes F8-F6 as functional material, and includes any of cyclohexylbenzene, methoxytoluene, 1-nonanol, dimethyl phthalate, acetophenone, and xylene as a solvent. Various types of ink were ejected from the ink ejection nozzle while changing the ejection speed V. The placement accuracy is then measured and evaluated by using the standard deviation 6σ. The ejection speed V was obtained by measuring the speed of a drop of 0.5 mm ejected from the inkjet head by using Litrex 120L, which is an inkjet evaluation device manufactured by ULVAC, Inc.

Figure 5:
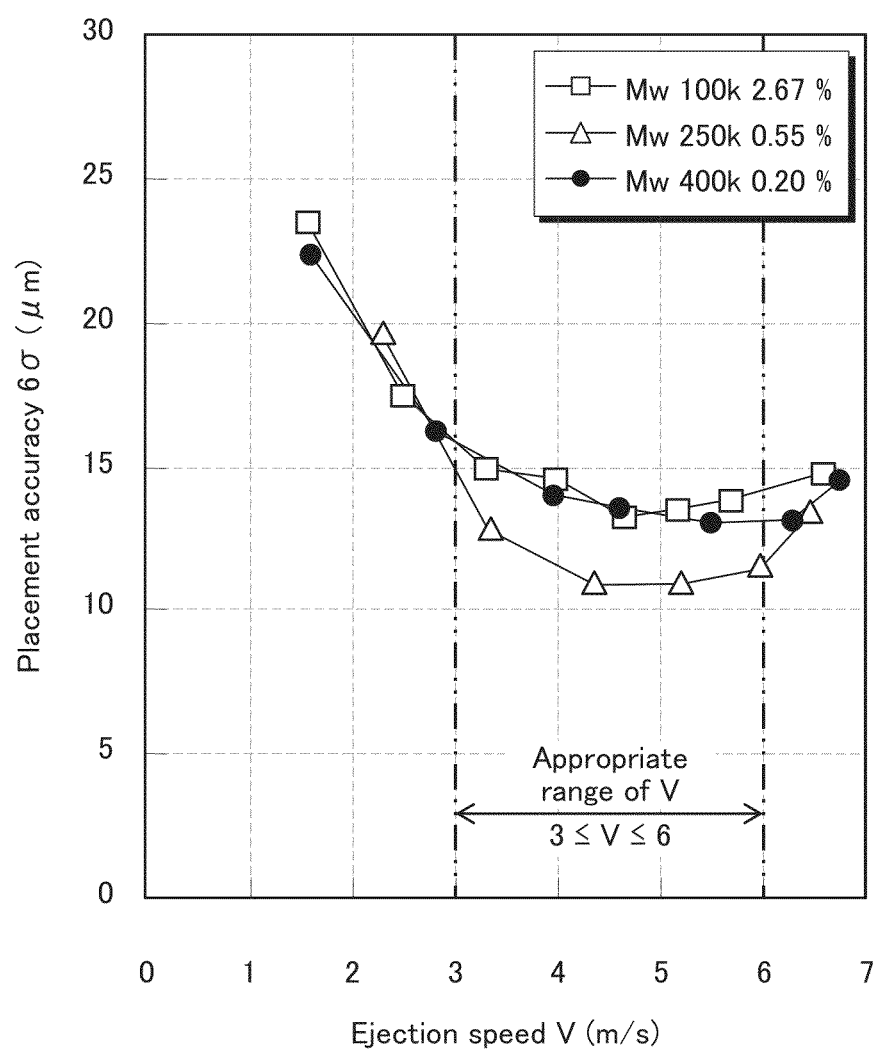
FIG. 5 shows a relation between ejection speed V and the placement accuracy.

FIG. 5 shows a relation between the ejection speed V and the placement accuracy. The results shown in FIG. 5 were obtained by the measurement. The results indicate that there is a correlation between the ejection speed V and the placement accuracy, and the preferred placement accuracy is obtained when the ejection speed V is a predetermined speed or more. Presumably, this is because the ink drop becomes less likely to be carried by air currents as the ejection speed V increases. It was found that, when the ejection speed V was 3 m/s or more, the placement accuracy did not exceed an allowable limit of 20 μm, even with a small error. A lower limit of the preferred ejection speed V was thus determined as 3 m/s.

It was also found that the types of solvent had little effect on the relation between the ejection speed V and the placement accuracy.

Figure 6:
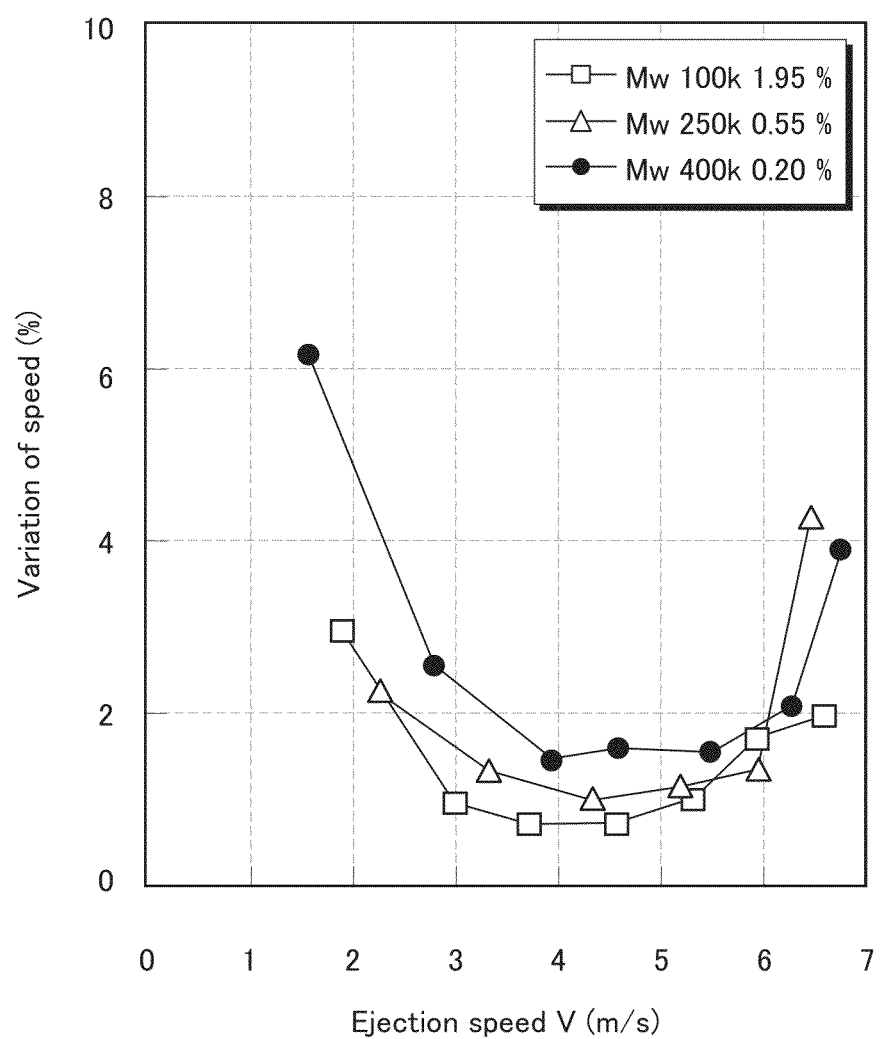
FIG. 6 shows a relation between the ejection speed V and a variation of the ejection speed.

FIG. 6 shows a relation between the ejection speed V and a variation of the ejection speed. The graph of FIG. 6 shows the ejection speed V on the X axis and shows, on the Y axis, a value obtained by dividing the standard deviation of the ejection speed by an average value of the ejection speed V. As shown in FIG. 6, it is considered that, when the ejection speed V is 3 m/s or more and is 5 m/s or less, the value shown on the Y axis is 2% or less and an ink drop is less likely to be affected by air currents. It is therefore preferable that the ejection speed V be 3 m/s or more and is 5 m/s or less.

(Correlation between Ejection Speed V and Breakup Characteristics of Ink Drop)

In the above-mentioned experiments, it was also found that, when the ejection speed V was increased, the ink drop broke up to generate satellites and the flight characteristics were degraded. In order to provide the preferred flight characteristics for an ink drop, the ink drop has to have preferred breakup characteristics. The preferred breakup characteristics of the ink drop refer to a state where the ink drop does not break up.

Figure 7A:
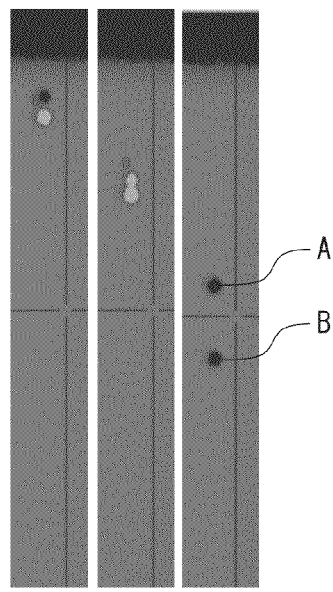
FIGS. 7A, 7B, 7C, and 7D illustrate examples of how an ink drop breaks up.
Figure 7B:
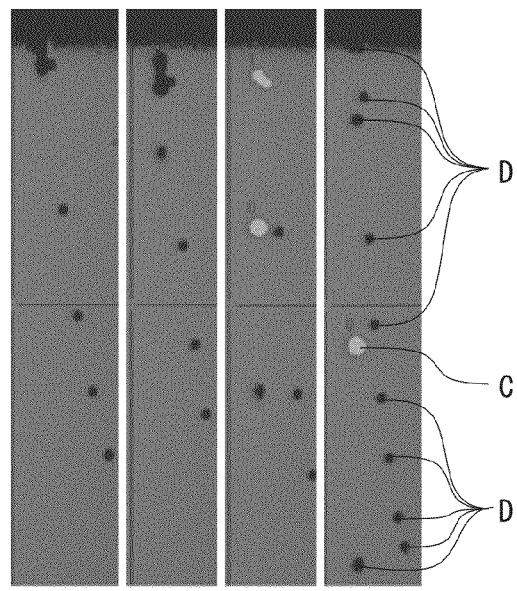

FIGS. 7A, 7B, 7C, and 7D illustrate examples of how an ink drop breaks up. As one example of how the ink drop breaks up, there is a case where the ink drop breaks up into a few small drops. In the example shown in FIG. 7A, the ink drop breaks up into two small drops A and B. If the ink drop breaks up as shown in FIG. 7A, it is not possible to control the ejection because determination of a main drop is not possible. As another example of how the ink drop breaks up, there is a case where the ink drop breaks up into a main drop and a plurality of satellites (small drops separated from the main drop). In the example shown in FIG. 7B, the ink drop breaks up into a main drop C and a plurality of satellites D. If the ink drop breaks up as shown in FIG. 7B, any of the satellites might be placed in a region other than the light-emitting layer-forming region. In view of above, an ink drop was determined to have preferred breakup characteristics when the ink drop did not break up.

Figure 7C:
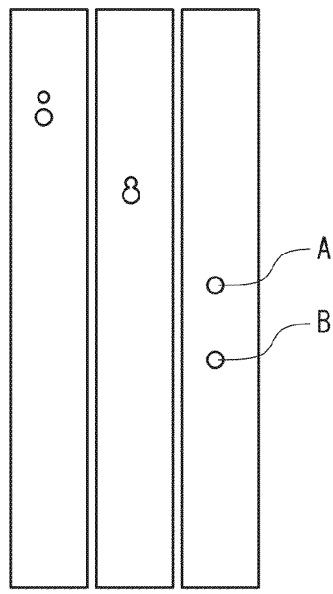
Figure 7D:
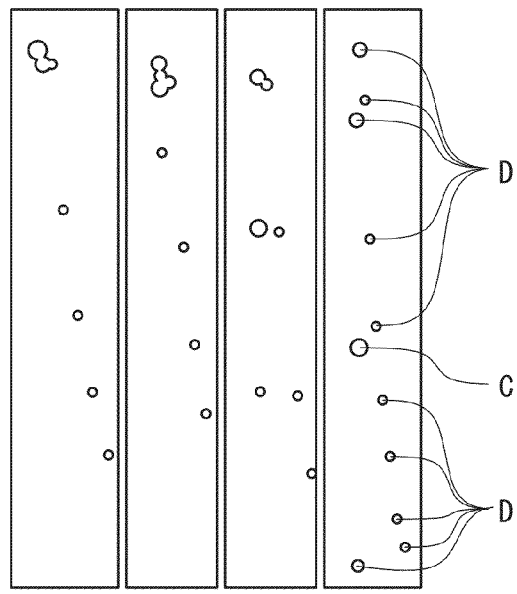

In order to improve visual understanding of how the ink drop breaks up, schematic diagrams for images shown in FIGS. 7A and 7B are respectively shown in FIGS. 7C and 7D.

The breakup characteristics were evaluated in the following manner. The breakup characteristics were evaluated by observing the flight of an ink drop to judge whether or not the ink drop breaks up. The flight of the ink drop was observed to examine a shape of the ejected ink drop with resolution of 1 usec by using Litrex 120L, which is the inkjet evaluation device manufactured by ULVAC, Inc.

When the ejection speed V exceeded 6 m/s, satellites were generated and thus the placement accuracy could not accurately be measured. An upper limit of the ejection speed V is therefore determined as 6 m/s.

The correlation between the ejection speed V and the flight characteristics is summarized as follows: When the ejection speed V is low, the preferred breakup characteristics is obtained (ink is less likely to break up) but the preferred straightness cannot be obtained. On the other hand, when the ejection speed V is high, the preferred straightness is obtained but the preferred breakup characteristics cannot be obtained (ink is more likely to break up). A preferred range of the ejection speed V is 3 m/s or more and is 6 m/s or less. As described above, the inventors found that, in addition to the straightness, the breakup characteristics were important (to prevent generation of satellites) for the flight characteristics.

(Correlation between Value Z and Breakup Characteristics of Ink Drop)

From the initial consideration, it was considered that the flight characteristics could sufficiently be controlled by conducting the experiments to find variables for the value Z and the ejection speed V and obtaining a formula indicating the correlation therebetween. However, since it was found that there was the upper limit of the ejection speed V from the perspective of the breakup characteristics of the ink drop, the inventors assumed that there would be some correlation between the value Z and the breakup characteristics of the ink drop, and further proceeded to a consideration.

At first, the inventors roughly considered the correlation between the value Z and the satellite generation speed without regard to the weight-average molecular weight. The satellite generation speed refers to an ejection speed at and above which a satellite is generated, and sets the upper limit to obtain the preferred flight characteristics determined by the value Z for each ink drop.

Figure 8:
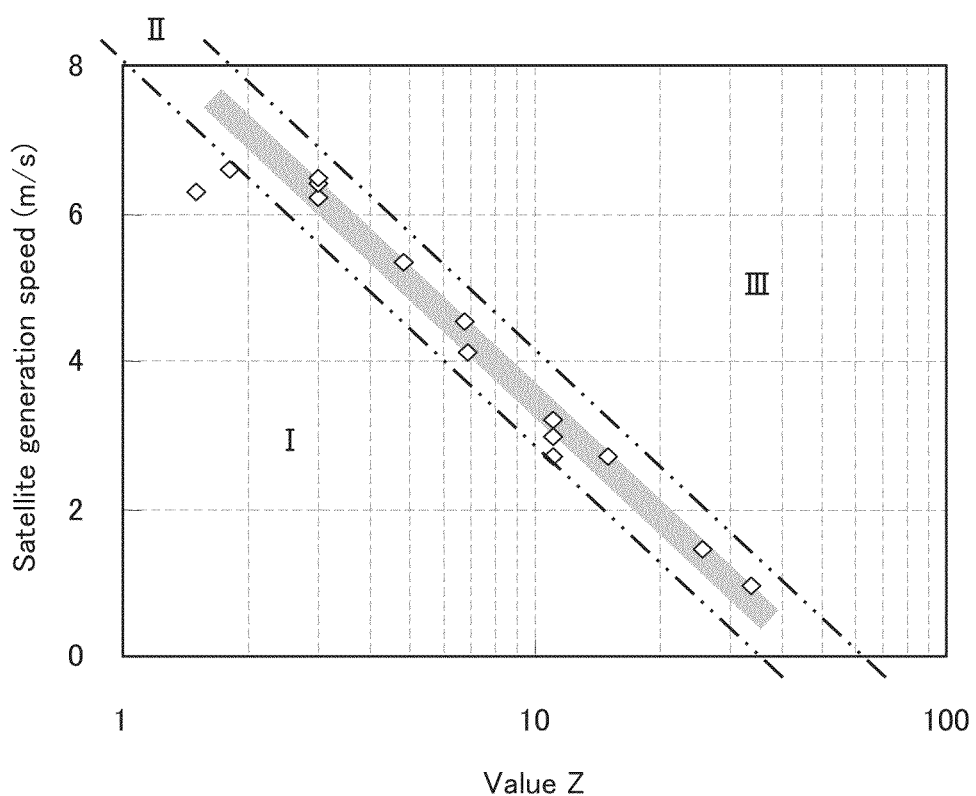
FIG. 8 shows a relation between the value Z and a satellite generation speed.
Figure 9A:
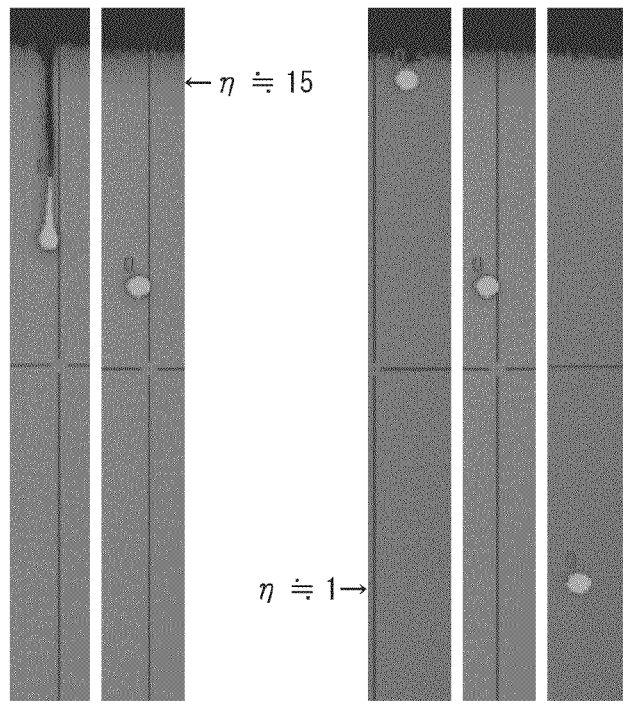
FIGS. 9A and 9B illustrate examples of an ink drop in an area I of FIG. 8.
Figure 9B:
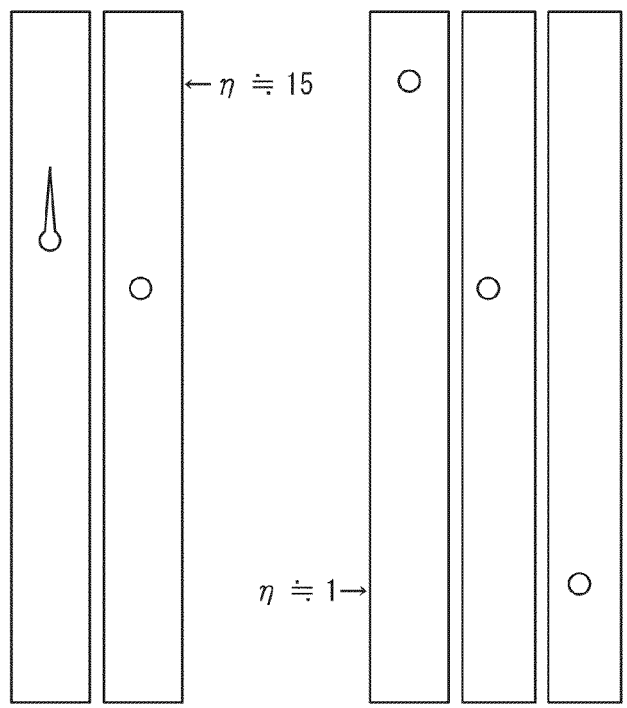
Figure 10A:
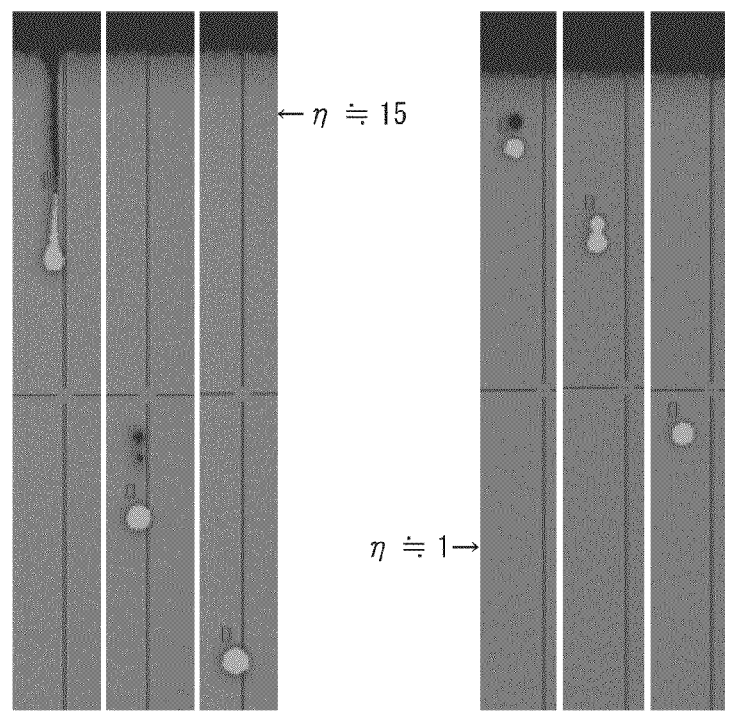
FIGS. 10A and 10B illustrate examples of an ink drop in an area II of FIG. 8.
Figure 10B:
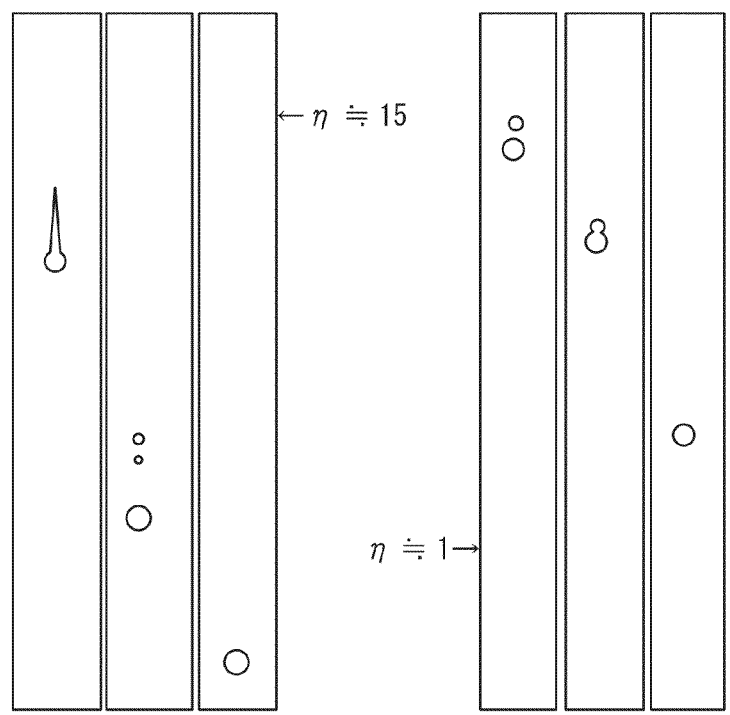
Figure 11A:
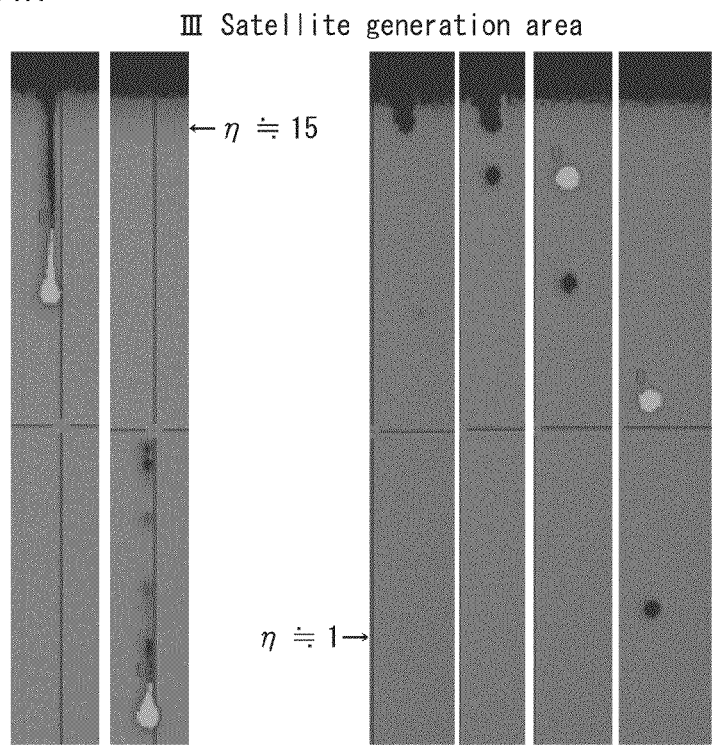
FIGS. 11A and 11B illustrate examples of an ink drop in an area III of FIG. 8.
Figure 11B:
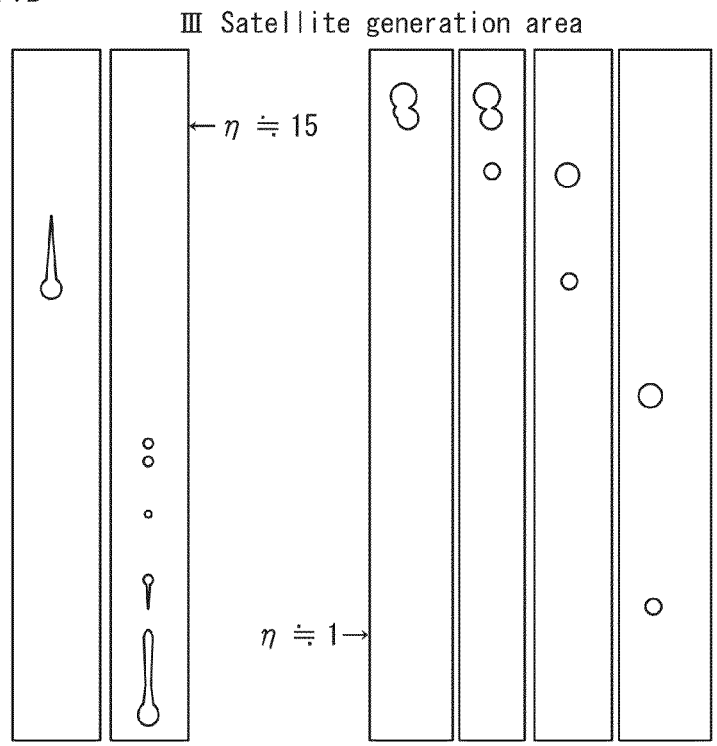

FIG. 8 shows the relation between the value Z and the satellite generation speed. FIGS. 9A and 9B illustrate examples of an ink drop in an area I of FIG. 8. FIGS. 10A and 10B illustrate examples of an ink drop in an area II of FIG. 8. FIGS. 11A and 11B illustrate examples of an ink drop in an area III of FIG. 8.

The viscosity η of ink was measured by using a viscometer referred to as AR-G2 (TA Instruments). The surface tension γ of ink was measured by using a surface tension meter referred to as DSA100 (manufactured by KRUSS). The density ρ of ink was calculated from the specific gravity of the ink (since the functional material has a low concentration, the specific gravity thereof is assumed to be one).

As shown in FIG. 8, there was a correlation between the value Z and the satellite generation speed. As shown in FIG. 9A, in the area I of FIG. 8, a satellite was not generated when the viscosity η of the ink was approximately 15 mPa·s and when the viscosity η of the ink was approximately 1 mPa·s. The area I is thus a normal area where ink drops are ejected one at a time. As shown in FIG. 10A, in the area II of FIG. 8, when the viscosity η of the ink was approximately 15 mPa·s, the ligament length of an ink drop increased (a phenomenon where the ink leaves a trail), and the ink drop broke up. When the viscosity 11 of the ink was approximately 1 mPa·s, however, the ink drop did not break up. As shown in FIG. 11A, in the area III of FIG. 8, satellites were generated when the viscosity η of the ink was approximately 15 mPa·s and when the viscosity η of the ink was approximately 1 mPa·s.

In order to improve visual understanding of how the ink drop breaks up, schematic diagrams of images shown in FIGS. 9A, 10A, and 11A are respectively shown in FIGS. 9B, 10B, and 11B.

The correlation between the value Z and the satellite generation speed was then considered in detail. The value Z was controlled by changing functional material and a solvent included in ink, the concentration (a ratio of the functional material to the ink), the viscosity η, the surface tension γ, and the density ρ of the ink, and the nozzle diameter r at a level shown in the table. Ink drops were ejected on the condition described with use of FIG. 2 to measure an ejection speed V at which satellites are generated. The droplet diameter r' of the ink depends on the diameter r of the ink ejection nozzle, and thus the diameter r is used instead of using the droplet diameter r' of the ink.

In order to evaluate the ink including functional material having a weight-average molecular weight greater than zero and equal to or less than 100,000, the experiments were conducted by using the ink including functional material having a weight-average molecular weight of 100,000 and the ink including functional material having a weight-average molecular weight of zero (ink not including functional material).

FIG. 12 shows experimental results on the relation between the value Z and the satellite generation speed. For example, in the case of No. 21 of FIG. 12, in which the value Z is 15.0, a satellite was generated when the ejection speed V was 2.7 m/s or more. In the case of No. 22, in which the value Z is 33.8, a satellite was generated when the ejection speed V was 0.9 m/s or more.

As described above, in order to keep an error of the placement accuracy equal to 20 μm or less, it is preferred that the ejection speed V be 3.0 m/s or more. In the case of No. 21, in which the satellite generation speed is 2.7 m/s, however, a satellite might be generated when the ejection speed V is 2.7 m/s or more. That is to say, in the case of No. 21, it is not possible to provide both of the preferred straightness and breakup characteristics. No. 21 was therefore evaluated as "x", which indicates that the preferred breakup characteristics cannot be obtained. Similarly, cases in each of which the satellite generation speed was 3.0 m/s or less were evaluated as "x", which indicates that the preferred breakup characteristics cannot be obtained. In contrast, cases in each of which the satellite generation speed exceeded 3.0 m/s were evaluated as "○", which indicates that the preferred breakup characteristics can be obtained.

In the column of "solvent" in FIG. 12, solvents a, b, c, d, e, f, g, h, i, j, k, l, and m respectively indicate acetophenone, xylene, xylene/1-nonanol=14/86, dimethyl phthalate/1-nonanol=50/50, acetophenone/dimethyl phthalate=17/83, xylene/dimethyl phthalate=25/75, xylene/1-nonanol=35/65, acetophenone/dimethyl phthalate=50/50, acetophenone/dimethyl phthalate=78/22, xylene/dimethyl phthalate=50/50, xylene/dimethyl phthalate=85/15, methoxytoluene, and cyclohexylbenzene.

Figure 13:
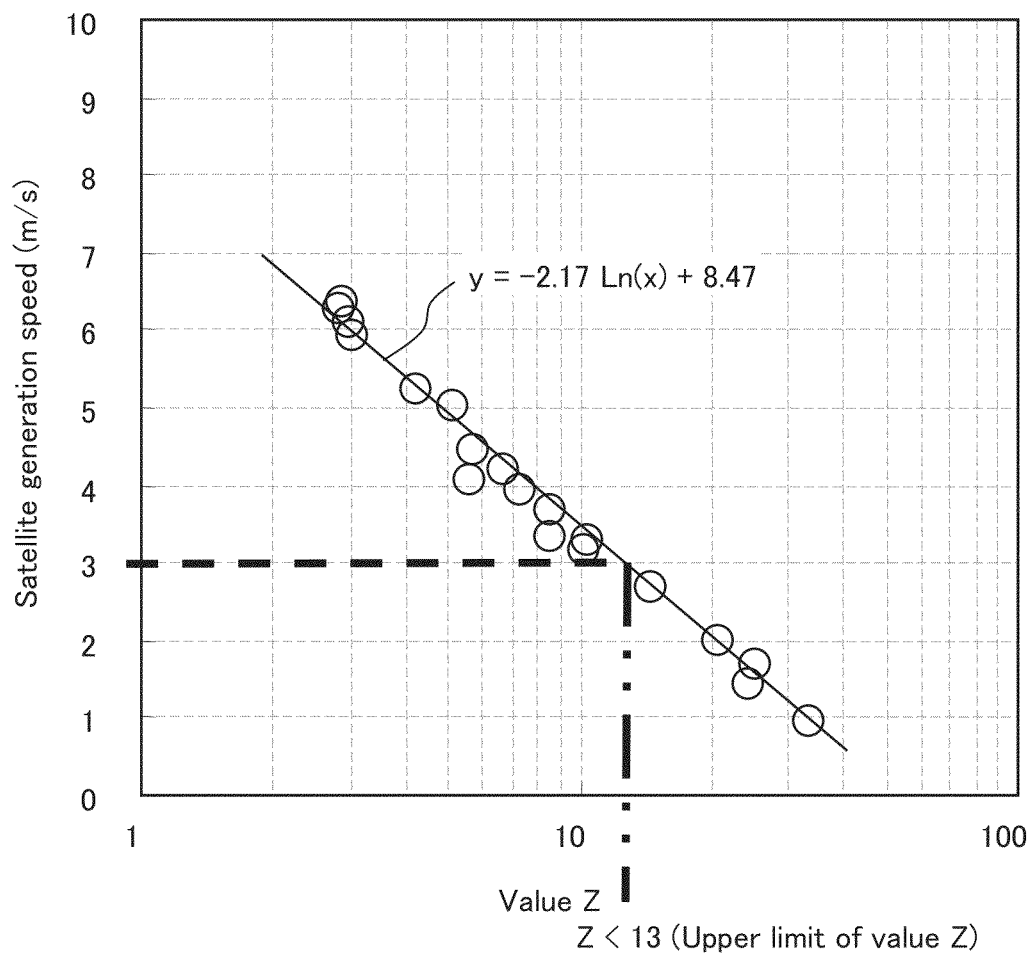
FIG. 13 shows the relation between the value Z and the satellite generation speed.

FIG. 13 shows the relation between the value Z and the satellite generation speed. When the experimental results No.

21 to No. 40 shown in FIG. 12 were plotted in the X and Y coordinates showing the value Z on the X axis and showing the satellite generation speed on the Y axis as shown in FIG. 13 to perform regression analysis, a regression equation as shown in the following Equation 8 was obtained, and it was found that there was a correlation between the value Z and the satellite generation speed. This means that speed at which satellites are generated can be estimated from the value Z.

$$y = -2.17 \operatorname{Ln}(x) + 8.47 \qquad \text{(Equation 8)}$$

In the graph of FIG. 13, an area below the regression line is an area in which satellites are not generated. It can be seen from the graph that the satellite generation speed falls below 3.0 m/s when the value Z exceeds 13. An upper limit of the value Z is therefore determined as 13.

(Summary)

As described above, it was found that the breakup characteristics of the ink drop did not depend only on the ejection speed V but depended on the variables for both of the ejection speed V and the value Z, and, in order to provide preferred breakup characteristics of the ink drop, it was important for the value Z and the ejection speed V to show a predetermined relation.

The inventors could arrive at the present invention by determining an unanticipated correlation existing between the value Z and the ejection speed V, which were each assumed to be independently defined at the beginning of the considerations.

Figure 14:
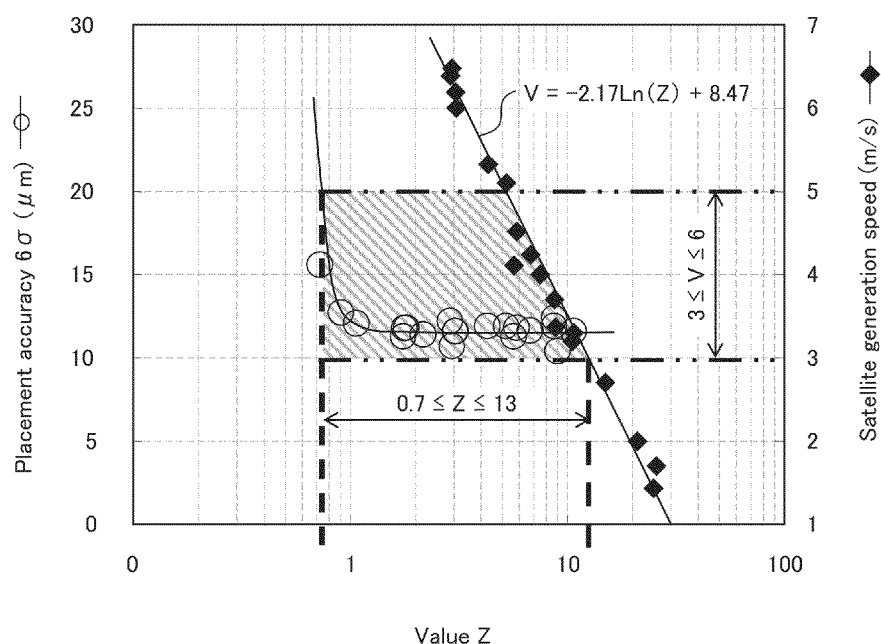
FIG. 14 shows relations between the value Z and the satellite generation speed, and between the value Z and the placement accuracy.

FIG. 14 shows relations between the value Z and the satellite generation speed (FIG. 13), and between the value Z and the placement accuracy (FIG. 4). In the graph of FIG. 14, a hatched range indicates a range of the value Z within which the preferred placement accuracy is provided and satellites are not generated, i.e., a range of the value Z within which the preferred flight characteristics can be obtained. When the value Z is increased, for example, by increasing the viscosity of the ink, the preferred breakup characteristics can be obtained (the ink is less likely to break up) but the straightness is degraded. On the other hand, when the value Z is decreased, the breakup characteristics are degraded (the ink is more likely to break up) but the preferred straightness can be obtained.

As described above, the inventors demonstrated by the experiments that the flight characteristics of the ink drop could be controlled by the value Z, and there was a correlation between the flight characteristics of the ink drop and the value Z. That is to say, the inventors succeeded in making the properties of the ink capable of providing the preferred flight characteristics predictable according to the inkjet head to be used, and in controlling the flight characteristics of the ink drop by generalizing a relation between the flight characteristics of the ink drop and the value Z for the ink drop, which is determined by the viscosity $\eta$, the surface tension $\gamma$, the density $\rho$ of the ink, and the diameter r of the ink ejection nozzle. This allowed for reduction of the burden in development of ink and ejection evaluation.

Furthermore, by defining the ejection speed V, the relation between the ejection speed V and the flight characteristics could be grasped more accurately. This lead to optimal design of ink according to the ink ejection nozzle of the inkjet device. The inventors found that the preferred flight characteristics could be obtained by controlling the value Z and the ejection speed V so that the above-mentioned Formula 1, Formula 2, and Formula 3 are satisfied. When the value Z is two or more and is ten or less, more preferred flight characteristics can be obtained.

[Ink]

The ink pertaining to one aspect of the present invention includes functional material as a material for a functional layer and a solvent dissolving the functional material, and has properties suitable for the inkjet method using the inkjet device (drop ejection method). As can be seen from FIGS. 3 and 12, it is preferred that the density $\rho$ of the ink be more than 827 g/m$^3$ and be 1190 g/m$^3$ or less, the surface tension $\gamma$ of the ink be more than 27.3 mN·m and be 41.9 mN·m or less, and the viscosity $\eta$ of the ink be 2.4 mPa·s or more and be 35.0 mPa·s or less. In this case, it is preferred that the diameter r of the ink ejection nozzle of the inkjet device be 0.02 mm or more and be 0.03 mm or less.

Specifically, F8-F6 (a copolymer of F8 (poly dioctyifluorene) and F6 (poly dihexylfluorene)) is preferred for use as the functional material. Other materials preferred for use as the functional material are a fluorene compound other than F8-F, such as F8 and F6, an oxinoid compound, a perylene compound, a coumarin compound, an azacoumarin compound, an oxazole compound, an oxadiazole compound, a perinone compound, a pyrrolo-pyrrole compound, a naphthalene compound, an anthracene compound, a fluoranthene compound, a tetracene compound, a pyrene compound, a coronene compound, a quinolone compound and an azaquinolone compound, a pyrazoline derivative and a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, an anthracene compound, a cyanine compound, an acridine compound, a metal complex of a 8-hydroxyquinoline compound, a metal complex of a 2-bipyridine compound, a complex of a Schiff base and a group three metal, a metal complex of oxine, a rare earth metal complex, etc., as recited in Japanese Patent Application Publication No. 5-163488. These compounds and complexes may be used alone, or one or more of these compounds and complexes may be used in combination.

In the present application, the above-mentioned experiments on the correlations between the value Z and the flight characteristics, and between the ejection speed V and the flight characteristics were conducted by using functional material having a weight-average molecular weight greater than zero and equal to or less than 100,000. The functional material having a weight-average molecular weight greater than zero and equal to or less than 100,000 is preferably used for ink for forming a light-emitting functional layer that emits red or green light, for example. The light-emitting functional layer that emits green light has a film thickness of 60 nm to 100 nm, for example. In order to obtain ink having a concentration suitable for designing the light-emitting functional layer having such a film thickness, it is preferred to use functional material having a weight-average molecular weight greater than zero and equal to or less than 100,000. It is more preferred to use functional material having a weight-average molecular weight equal to or greater than 80,000 and equal to or less than 100,000. When F8-F6 is used as the functional material, a minimum value of the weight-average molecular weight thereof is theoretically 722.

FIG. 15 shows a relation among the value Z, the concentration of ink, and the viscosity $\eta$ of the ink. The value Z, the concentration of the ink, and the viscosity $\eta$ of the ink shown in FIG. 15 are obtained when F8-F6 is used as functional material, and a mixture of cyclohexylbenzene and methoxytoluene is used as a solvent (with a mixing ratio of cyclohexylbenzene to methoxytoluene is 8:2). In the case of the functional material having a weight-average molecular weight greater than zero and equal to or less than 100,000, a preferred range of the concentration (wt/vol) of the ink is 0.5% or more and is 3.0% or less, a preferred range of the viscosity η of the ink is 4.5 mPa·s or more and is 28.0 mPa·s or less, and a preferred range of the value Z is 0.9 or more and is 6.0 or less.

When F8-F6 is used as the functional material, it is preferred to use cyclohexylbenzene, methoxytoluene, methylnaphthalene, xylene, or the like as the solvent. The solvent may include a single material or may be a mixture of a plurality of materials as long as the solvent can dissolve the functional material.

[Organic Display Panel, Organic Light-emitting Element, and Substrate]

Figure 16:
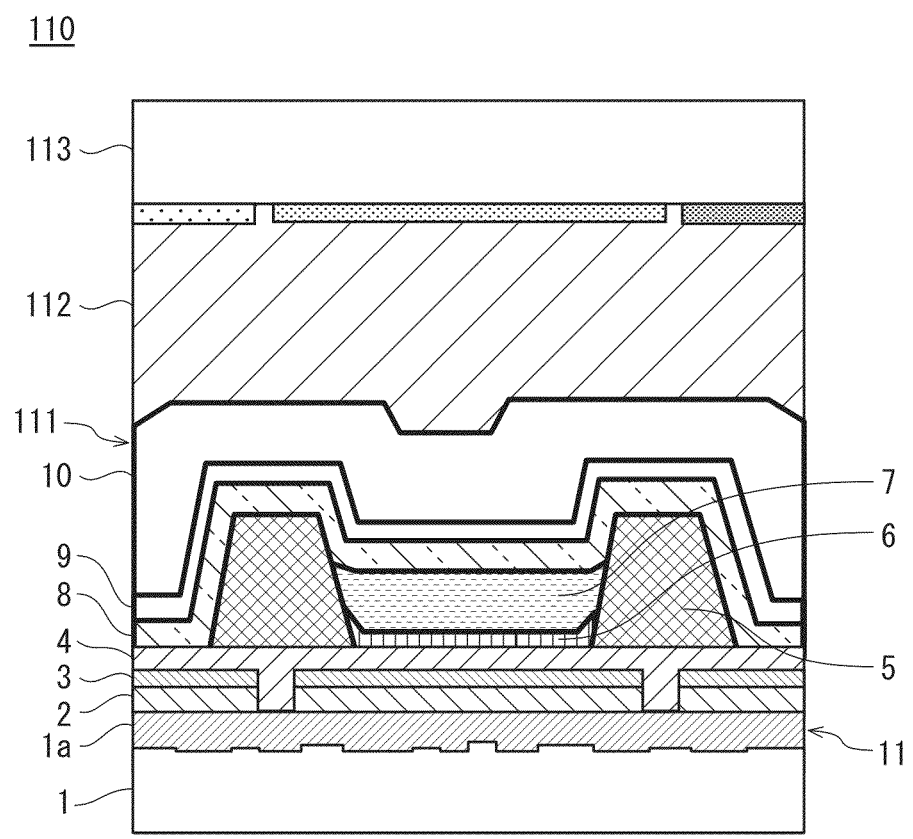
FIG. 16 is a schematic diagram illustrating a laminated structure of layers included in an organic display panel pertaining to one aspect of the present invention.

FIG. 16 is a schematic diagram illustrating a laminated structure of layers included in an organic display panel pertaining to one aspect of the present invention. As illustrated in FIG. 16, an organic display panel 110 pertaining to one aspect of the present invention has a structure in which a color filter substrate 113 is bonded onto an organic light-emitting element 111 pertaining to one aspect of the present invention via a sealing material 112.

The organic light-emitting element 111 is a top emission-type organic light-emitting element in which the pixels for the colors R, G and B are arranged in a matrix or in lines, and each pixel has a laminated structure composed of layers formed on a TFT substrate 1.

On the TFT substrate 1, first anode electrodes 2 and second anode electrodes 3 constituting a first electrode are formed in a matrix or in lines. On the anode electrodes 2 and 3, a hole injection layer 4 is formed. On the hole injection layer 4, banks 5 for defining pixels are formed.

A substrate 11 pertaining to one aspect of the present invention includes the TFT substrate 1, the anode electrodes 2 and 3, and the banks 5, and has openings 12 corresponding to respective pixel units. The banks 5 are each formed above the anode electrodes 2 and 3 to partition adjacent pixel units.

In an area defined by the banks 5, a hole transport layer 6 and an organic light-emitting layer 7 are formed in the stated order. On the organic light-emitting layer 7, an electron transport layer 8, a cathode electrode 9 as a second electrode, and a passivation layer 10 are formed continuously across adjacent pixels, passing over the banks 5.

The area defined by the banks 5 has a multi-layered structure in which the hole injection layer 4, the hole transport layer 6, the organic light-emitting layer (functional layer) 7, and the electron transport layer 8 are formed in the stated order.

The multi-layered structure may include another layer such as an electron injection layer. Typical examples of the multi-layered structure include: (i) the hole injection layer/the organic light-emitting layer; (ii) the hole injection layer/the hole transport layer/the organic light-emitting layer; (iii) the hole injection layer/the organic light-emitting layer/the electron injection layer; (iv) the hole injection layer/the hole transport layer/the organic light-emitting layer/the electron injection layer; (v) the hole injection layer/the organic light-emitting layer/a hole blocking layer/the electron injection layer; (vi) the hole injection layer/the hole transport layer/the organic light-emitting layer/the hole blocking layer/the electron injection layer; (vii) the organic light-emitting layer/the hole blocking layer/the electron injection layer; and (viii) the organic light-emitting layer/the electron injection layer.

The TFT substrate 1 includes a base substrate and an amorphous TFT (an EL element drive circuit) formed on the base substrate. The base substrate is, for example, made of an insulating material such as alkali-free glass, soda glass, non-fluorescent glass, phosphate glass, borate glass, quartz, acrylic resin, styrenic resin, polycarbonate resin, epoxy resin, polyethylene, polyester, silicone resin, and alumina.

The first anode electrode 2 is made, for example, of Ag (silver), APC (alloy of silver, palladium, and copper), ARA (alloy of silver, rubidium and, gold), MoCr (alloy of molybdenum and chromium), or NiCr (alloy of nickel and chromium). In the case of a top emission-type organic light-emitting element, it is preferred that the first anode electrode 2 be made of a light reflective material.

The second anode electrode 3 is interposed between the first anode electrode 2 and the hole injection layer 4, and has a function to enhance bonding therebetween.

It is preferred that the hole injection layer 4 be made of a metal compound such as a metal oxide, a metal nitride, or a metal oxynitride. When the hole injection layer 4 is made of a metal oxide, injection of holes is facilitated. Accordingly, electrons injected into the organic light-emitting layer 7 contribute to light emission in an effective manner, which results in excellent light-emitting characteristics of the organic light-emitting layer 7. Examples of the metal oxide include oxides of: Cr (chromium); Mo (molybdenum); W (tungsten); V (vanadium); Nb (niobium); Ta (tantalum); Ti (titanium); Zr (zirconium); Hf (hafnium); Sc (scandium); Y (yttrium); Th (thorium); Mn (manganese); Fe (iron); Ru (ruthenium); Os (osmium); Co (cobalt); Ni (nickel); Cu (copper); Zn (zinc); Cd (cadmium); Al (aluminum); Ga (gallium); In (indium); Si (silicon); Ge (germanium); Sn (tin); Pb (lead); Sb (antimony); Bi (bismuth); and so-called rare earth elements from La (lanthanum) to Lu (lutetium). Among such metal oxides, $Al_2O_3$ (aluminum oxide), CuO (copper oxide), and SiO (silicon oxide) are particularly efficient in extending the life of the light-emitting element.

It is preferred that the banks 5 be made of an organic material such as a resin, or an inorganic material such as glass. Examples of the organic material are an acrylic resin, a polyimide resin, and a novolac type phenolic resin. Examples of the inorganic material are SiO, (silicon oxide) and $Si_3N_4$ (silicon nitride). It is preferred that the banks 5 be resistant to organic solvents, transmit visible light to some extent, and have insulating properties. In addition, since there are cases where the banks 5 undergo etching, baking and other similar processing, it is preferred that the banks 5 be made of a material that is highly resistant to such processing.

The banks 5 may be pixel banks or line banks. When the banks 5 are the pixel banks, the banks 5 are formed so as to surround the organic light-emitting layer 7 corresponding to one pixel from all directions. When the banks 5 are the line banks, the banks 5 are formed so as to partition pixels by columns or by rows. The banks 5 exist at both sides of the organic light-emitting layer 7 in either the row direction or in the column direction, and the organic light-emitting layer 7 is formed so as to be continuous in either the column direction or the row direction.

The hole transport layer 6 has a function to transport holes injected from the anode electrodes 2 and 3 to the organic light-emitting layer 7. It is preferred that the hole transport layer 6 be made of poly(3,4-ethylenedioxythiophene) doped with polystyrene sulphonate (PEDOT-PSS), or a derivative (copolymer or the like) thereof.

The organic light-emitting layer 7 has a function to emit light by making use of the phenomenon of electroluminescence. It is preferred that the organic light-emitting layer 7 be made, for example, of the functional material included in the ink pertaining to one aspect of the present invention.

The electron transport layer 8 has a function to transport electrons injected from the cathode electrode 9 to the organic light-emitting layer 7. It is preferred that the electron transport layer 8 be made, for example, of barium, phthalocyanine, lithium fluoride, or a mixture of any of these materials.

The cathode electrode 9 is made, for example, of ITO or IZO (Indium Zinc Oxide). In the case of the top emission-type organic light-emitting element, it is preferred that the passivation layer 10 be made of a light-transmissive material.

The passivation layer 10 has a function to prevent the organic light-emitting layer 7 and the like from being exposed to moisture or air, and is made, for example, of SiN (silicon nitride) or SiON (silicon oxynitride). In the case of the top emission-type organic light-emitting element, it is preferred that the passivation layer 10 be made of a light-transmissive material.

The organic light-emitting element 111 and the organic display panel 110 having the above-described structure has excellent light-emitting characteristics, as they are manufactured by using a method of manufacturing an organic light-emitting element pertaining to one aspect of the present invention.

[Inkjet Device and Method of Manufacturing Organic Light-Emitting Element]

Figure 17:
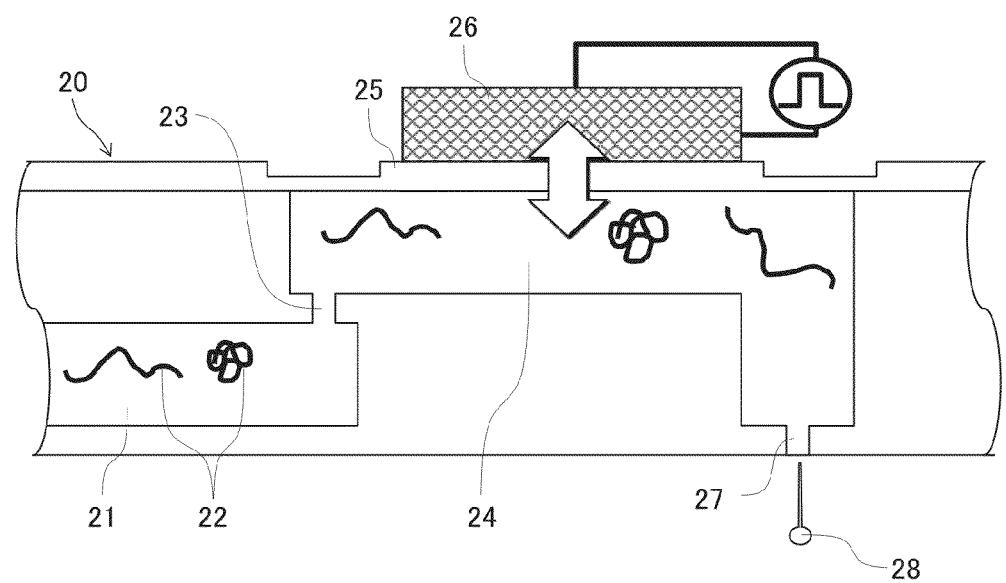
FIG. 17 illustrates a structure of an inkjet device pertaining to one aspect of the present invention.

The following describes an inkjet device and a method of manufacturing an organic light-emitting element pertaining to one aspect of the present invention with use of FIGS. 17, 18A to 18G, and 19A to 19E. FIG. 17 illustrates a structure of an inkjet device pertaining to one aspect of the present invention. FIGS. 18A to 18G and 19A to 19E are a process chart showing the method of manufacturing the organic light-emitting element pertaining to one aspect of the present invention.

The method of manufacturing the organic light-emitting element pertaining to one aspect of the present invention includes five steps.

In the first step, ink pertaining to one aspect of the present invention is prepared and a common ink chamber 21 of an inkjet device 20 pertaining to one aspect of the present invention is filled with the ink, as illustrated in FIG. 17. The ink includes functional material 22.

The ink filling the common ink chamber 21 is transported to a pressure generation chamber 24 through an ink common path 23. The wall of the pressure generation chamber 24 partially includes a vibrating plate 25. By heating the vibrating plate 25 with a heater 26 to cause the vibrating plate 25 to vibrate in directions indicated by an arrow, the pressure generation chamber 24 expands and contracts. By pressure generated by the expansion and contraction of the pressure generation chamber 24, a drop 28 of the ink is ejected from an ink ejection nozzle 27.

In the second step, the substrate 11 having a base layer including the first electrodes 2 and 3 is prepared to form the organic light-emitting layer 7.

Specifically, the TFT substrate 1 is prepared first. As illustrated in FIG. 18A, an upper surface of the TFT substrate 1 is protected by a protective resist.

The protective resist covering the TFT substrate 1 is then removed as illustrated in FIG. 18B. By spin-coating the TFT substrate 1 with an organic resin, and patterning the spin-coated TFT substrate 1 by PR/PE (photoresist/photoetching), a planarizing film 1a (having a thickness of 4 μm, for example) is formed as illustrated in FIG. 18C.

As illustrated in FIG. 18D, the first anode electrodes 2 are then formed on the planarizing film 1a. The first anode electrodes 2 are formed, for example, by forming a thin film of APC by sputtering, and then by patterning the thin film by PR/PE in a matrix (so as to have a thickness of 150 nm, for example). The first anode electrodes 2 may be formed by a vacuum deposition method or the like.

As illustrated in FIG. 18E, the second anode electrodes 3 are formed in a matrix. The second anode electrodes 3 are formed, for example, by forming a thin film of ITO by plasma deposition, and then by patterning the ITO thin film by PR/PE (so as to have a thickness of 110 nm, for example).

As illustrated in FIG. 18F, the hole injection layer 4 is formed over the second anode electrodes 3. The hole injection layer 4 is formed, for example, by sputtering a material for achieving a hole injection function, and then by patterning the material by PR/PE (so as to have a thickness of 40 nm, for example). The hole injection layer 4 is formed not only on the anode electrodes 3 but also over the entire upper surface of the TFT substrate 1.

As illustrated in FIG. 18G, the banks 5 are then formed on the hole injection layer 4. Areas on the hole injection layer 4 in which the banks 5 are formed correspond to boundaries between adjacent light-emitting layer-forming regions. The banks 5 are formed by forming a bank material layer so as to cover the entire upper surface of the hole injection layer 4, and then by removing parts of the bank material layer by PR/PE (so as to have a thickness of 1 μm, for example). The banks 5 may be line banks arranged in stripes extending only in the vertical direction, or may be pixel banks extending both in the vertical and horizontal directions to be in a lattice shape as a whole in a plan view.

As shown in FIG. 19A, each concavity formed between the banks 5 is filled with ink including a material for the hole transport layer and the ink is dried to form the hole transport layer 6 (having a thickness of 20 nm, for example).

In the third step, as illustrated in FIG. 19B, the inkjet device 20 is positioned above the substrate 11, and is caused to eject a drop of the ink onto the hole injection layer 4 in regions corresponding to the openings 12 between the banks 5.

In the fourth step, the ink filling each concavity is dried under reduced pressure and baked to form the organic light-emitting layer 7 (having a thickness of 60 nm to 90 nm, for example).

As illustrated in FIG. 19C, the electron transport layer 8 (having a thickness of 20 nm) is then formed to cover the banks 5 and the organic light-emitting layer 7 by ETL deposition.

In the fifth step, as illustrated in FIG. 19D, the second electrode 9, which has a different polarity from the first electrodes 2 and 3, is formed above the organic light-emitting layer 7 by plasma deposition of a light-transmissive material (so as to have a thickness of 100 nm).

As illustrated in FIG. 19E, the passivation layer 10 is then formed on the cathode electrode 9 by CVD (so as to have a thickness of 1 μm).

The top emission-type organic light-emitting element is manufactured in the above-mentioned manner.

[Organic Display Device]

Figure 20:
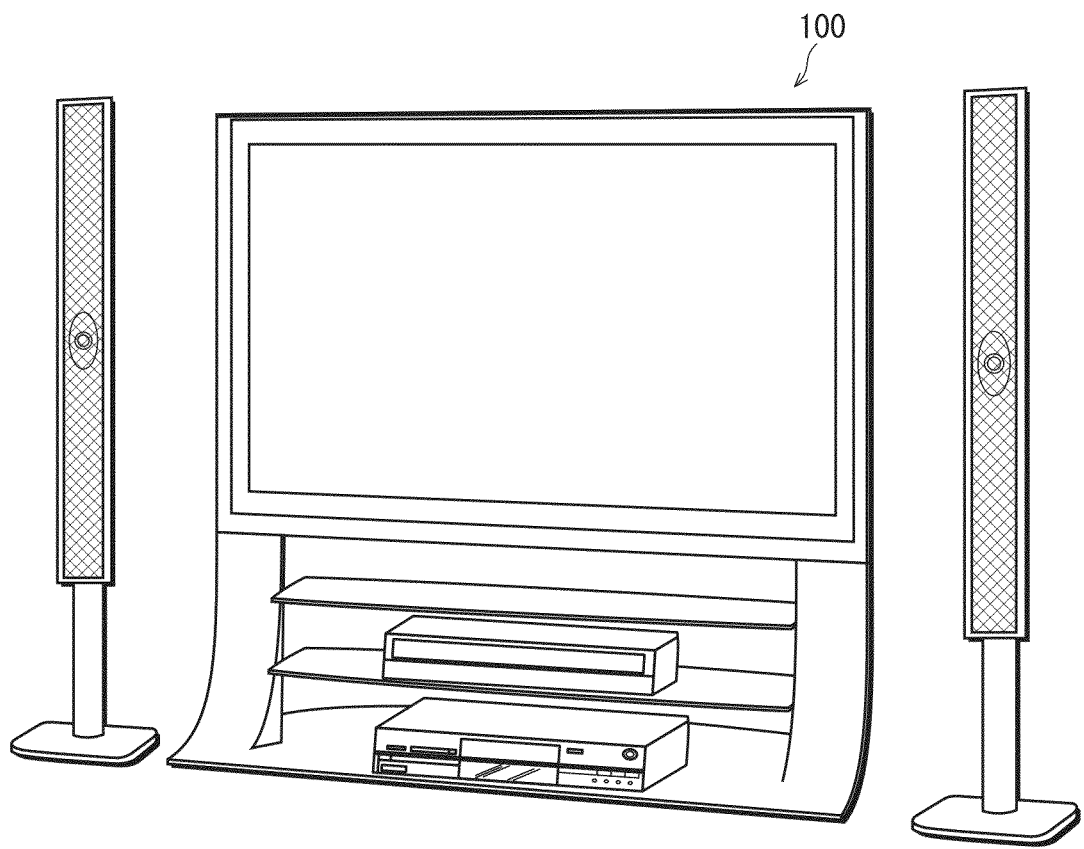

FIG. 20 is a perspective view illustrating an organic display device pertaining to one aspect of the present invention and the like. As illustrated in FIG. 20, a display device 100 pertaining to one aspect of the present invention is an organic EL display formed by regularly arranging pixels each emitting light of R, G, or B color in the column and the row directions so as to form a matrix. Each of the pixels includes the organic EL element pertaining to one aspect of the present invention.

Figure 21:
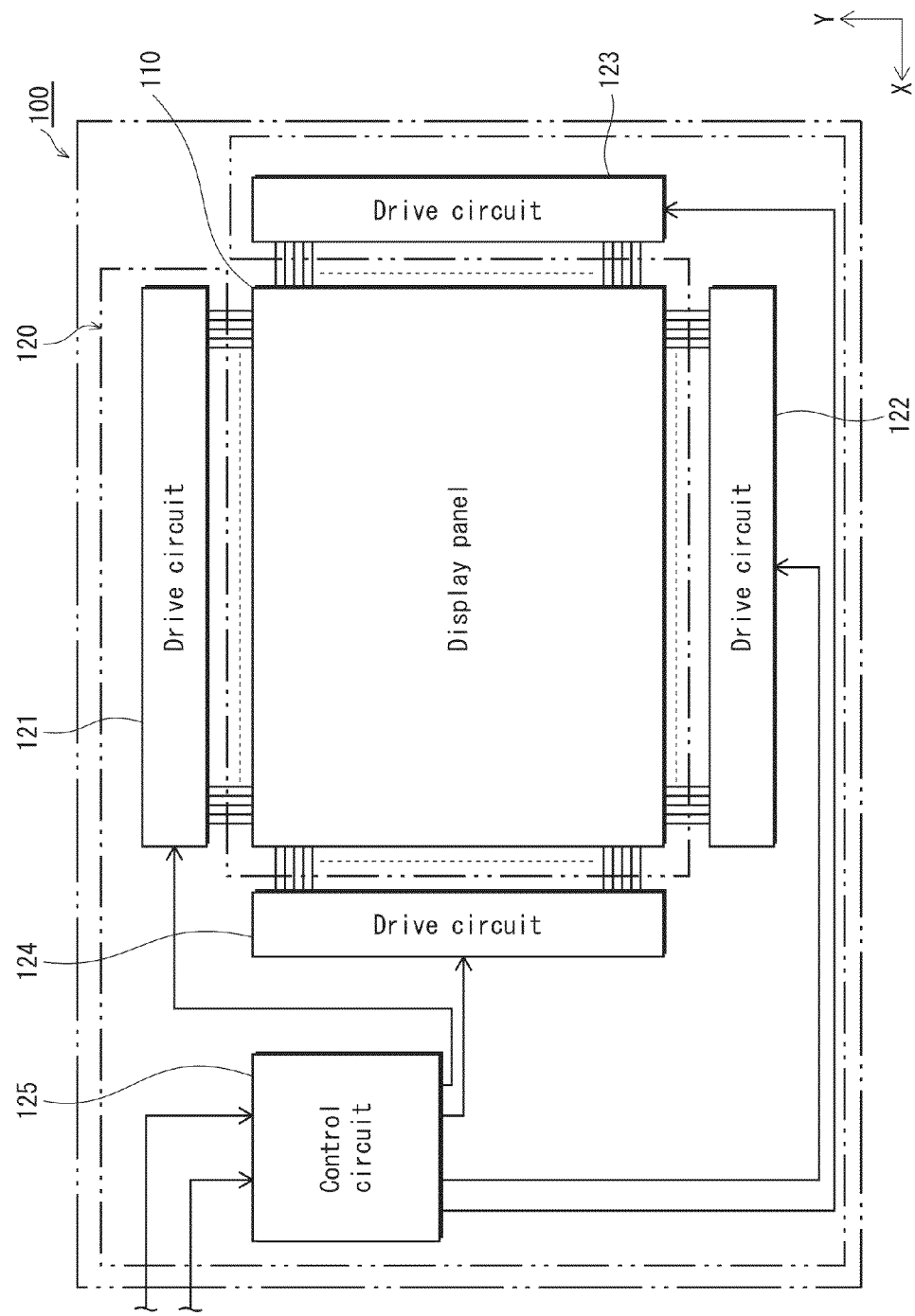
FIG. 21 illustrates an overall structure of a display device pertaining to one aspect of the present invention.

FIG. 21 illustrates an overall structure of the organic display device pertaining to one aspect of the present invention. As illustrated in FIG. 21, the organic display device 100 includes the organic display panel 110 pertaining to one aspect of the present invention and a drive control unit 120 connected to the organic display panel 110. The drive control unit 120 includes four drive circuits 121 to 124 and a control circuit 125. In the organic display device 100 actually implemented, the arrangement of the drive control unit 120 relative to the organic display panel 110 and the connection between the drive control unit 120 and the organic display panel 110 are not limited to those described above.

The organic display device 100 having the above-mentioned structure provides excellent image quality, as it utilizes the organic light-emitting element having excellent light-emitting characteristics.

[Organic Light-emitting Device]

Figure 22A:
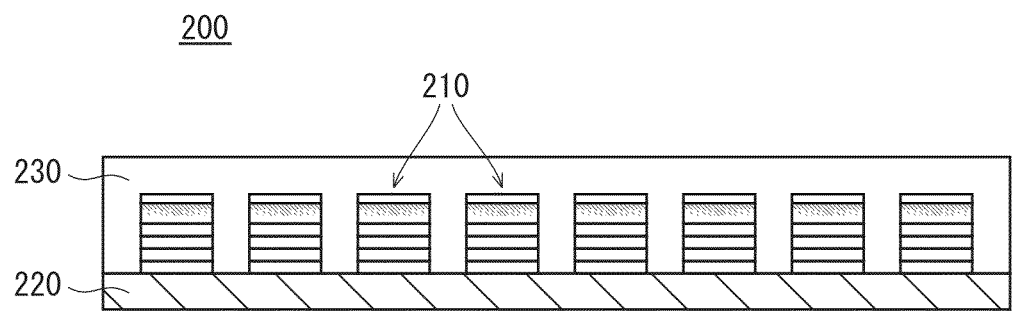
FIGS. 22A and 22B illustrate an organic light-emitting device pertaining to one aspect of the present invention.
Figure 22B:
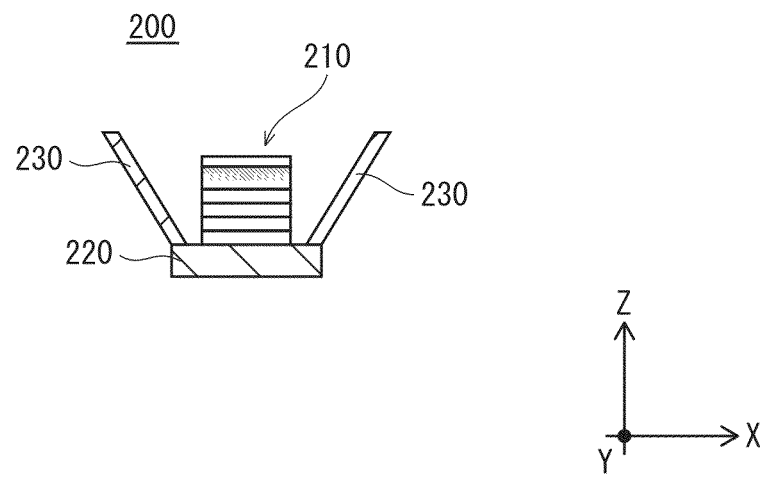

FIGS. 22A and 22B are respectively a vertical cross-sectional view and a horizontal cross-sectional view of the organic light-emitting device pertaining to one aspect of the present invention. As illustrated in FIGS. 22A and 22B, an organic light-emitting device 200 includes: a plurality of organic light-emitting elements 210 pertaining to one aspect of the present invention; a base 220 having the organic light-emitting elements 210 mounted on an upper surface thereof; and a pair of reflection members 230 attached to the base 220 so as to sandwich the organic light-emitting elements 210. Each of the organic light-emitting elements 210 is electrically connected to an electrically conductive pattern (not illustrated) formed on the base 220, and emits light by driving power provided by the electrically conductive pattern. The reflection members 230 control distribution of a portion of light emitted from the organic light-emitting elements 210.

The organic light-emitting device 200 having the above-mentioned structure provides excellent image quality, as it utilizes the organic light-emitting element having excellent light-emitting characteristics.

[Modifications]

Specific explanation has been provided of the method of manufacturing the organic light-emitting element, the organic display panel, the organic light-emitting device, the method of forming the functional layer, the ink, the substrate, the organic light-emitting element, the organic display device, and the inkjet device pertaining to one aspect of the present invention. It should be noted, however, that the above-mentioned embodiment is merely one example used to describe the effects of the structure of the present invention, and therefore, the present invention should not be construed as being limited to the above-mentioned embodiment.

For example, the ink for the organic light-emitting element pertaining to one aspect of the present invention is not limited to the ink for forming the organic light-emitting layer, and may be ink for forming a functional layer other than the organic light-emitting layer, such as the hole transport layer, the electron transport layer, the hole injection layer, and the electron injection layer.

The organic light-emitting element pertaining to one aspect of the present invention is not limited to the top emission-type organic light-emitting element, and may be the bottom emission-type organic light-emitting element.

Regarding the organic display panel pertaining to one aspect of the present invention, although the color of light emitted from the organic light-emitting layer is not referred to in the above-mentioned embodiment, the organic display panel may achieve not only monochrome display but also full color display. In the organic display panel that achieves full color display, the organic light-emitting element corresponds to one sub-pixel for each of the colors R, G and B, and a combination of three adjacent sub-pixels for the colors R, G, and B form one pixel. A plurality of such pixels are arranged in a matrix to form an image display region of the organic display panel.

The ink pertaining to one aspect of the present invention is not limited to the ink for the organic light-emitting element and may be ink for an organic transistor element.

INDUSTRIAL APPLICABILITY

The ink for the organic light-emitting element pertaining to one aspect of the present invention is widely applicable to a process of manufacturing the organic light-emitting element by a wet process. In addition, the organic light-emitting element pertaining to one aspect of the present invention is widely applicable in, for example, the field of passive matrix-type and active matrix-type organic display devices and organic light-emitting devices.

REFERENCE SIGNS LIST 2, 3 first electrode
5 bank
6 functional layer
9 second electrode
11 substrate
12 opening
20 inkjet device
22 functional material
27 ink ejection nozzle
100 organic light-emitting device
110 organic display panel
111 organic light-emitting element
200 organic display device

The invention claimed is:

1. A method of manufacturing an organic light-emitting element, comprising:

preparing ink including functional material as a material for a functional layer and a solvent dissolving the functional material, and filling an inkjet device having an ink ejection nozzle with the ink, the functional material having a weight-average molecular weight greater than zero and equal to or less than 100,000;

preparing a substrate having a base layer including a first electrode;

positioning the inkjet device above the substrate, and causing the inkjet device to eject a drop of the ink onto the base layer of the substrate;

forming the functional layer by drying the ink ejected onto the base layer of the substrate; and forming a second electrode above the functional layer, wherein in the preparation of the ink, when a value Z denotes a reciprocal of the Ohnesorge number Oh determined by density $\rho$ (g/m$^3$), surface tension $\gamma$ (nM·m), and viscosity $\eta$ (mPa·s) of the ink and a diameter r (mm) of the ink ejection nozzle, the value Z is within a range of Formula 1, in the ejection of the drop of the ink, speed V (m/s) of the ejected drop of the ink is within a range of Formula 2, and the value Z and the speed V (m/s) satisfy Formula 3:

$$0.7 \leq Z \leq 13$$

where $Z = 1/\text{Ohnesorge number } Oh = (r \cdot \rho \cdot \gamma)^{1/2}/\eta$ \hfill (Formula 1);

$$3 \leq V \leq 6$$ \hfill (Formula 2); and $$V \leq -2.17 \, \text{Ln}(Z) + 8.47$$ \hfill (Formula 3).

2. The method of manufacturing the organic light-emitting element of claim 1, wherein
the value Z is two or more and is ten or less, and
the speed V is 3 m/s or more and is 5 m/s or less.

3. The method of manufacturing the organic light-emitting element of claim 1, wherein
the density $\rho$ of the ink is more than 827 g/m$^3$ and is 1190 g/m$^3$ or less,
the surface tension $\gamma$ of the ink is more than 27.3 mN·m and is 41.9 mN·m or less,
the viscosity $\eta$ of the ink is more than 2.4 mPa·s and is 35.0 mPa·s or less, and
the diameter r of the ink ejection nozzle is 0.02 mm or more and is 0.03 mm or less.

4. The method of manufacturing the organic light-emitting element of claim 1, wherein
in the preparation of the substrate, the substrate has a plurality of openings corresponding to respective pixel units and includes a plurality of banks each formed above the base layer to partition adjacent pixel units, and
in the ejection of the drop of the ink, drops of the ink are ejected onto the base layer in regions corresponding to the openings between the banks.

5. An organic display panel utilizing the organic light-emitting element manufactured by the method of claim 1.

6. An organic light-emitting device utilizing the organic light-emitting element manufactured by the method of claim 1.

7. An organic display device utilizing the organic light-emitting element manufactured by the method of claim 1.

8. A method of forming a functional layer, comprising:
preparing ink including functional material as a material for the functional layer and a solvent dissolving the functional material, and filling an inkjet device having an ink ejection nozzle with the ink, the functional material having a weight-average molecular weight greater than zero and equal to or less than 100,000;
preparing a substrate on which the functional layer is to be formed;
positioning the inkjet device above the substrate, and causing the inkjet device to eject a drop of the ink onto the substrate; and
forming the functional layer by drying the ink ejected onto the substrate; and, wherein
in the preparation of the ink, when a value Z denotes a reciprocal of the Ohnesorge number Oh determined by density $\rho$ (g/m$^3$), surface tension $\gamma$ (mN·m), and viscosity $\eta$ (mPa·s) of the ink and a diameter r (mm) of the ink ejection nozzle, the value Z is within a range of Formula 1,
in the ejection of the drop of the ink, speed V (m/s) of the ejected drop of the ink is within a range of Formula 2, and
the value Z and the speed V (m/s) satisfy Formula 3:

$$0.7 \leq Z \leq 13$$

where $Z = 1/\text{Ohnesorge number } Oh = (r \cdot \rho \cdot \gamma)^{1/2}/\eta$ (Formula 1);

$$3 \leq V \leq 6$$ (Formula 2); and $$V \leq -2.17 \, \text{Ln}(Z) + 8.47$$ (Formula 3).

9. The method of forming the functional layer of claim 8, wherein
the value Z is two or more and is ten or less, and
the speed V is 3 m/s or more and is 5 m/s or less.

10. The method of forming the functional layer of claim 8, wherein
the density $\rho$ of the ink is more than 827 g/m$^3$ and is 1190 g/m$^3$ or less,
the surface tension $\gamma$ of the ink is more than 27.3 mN·m and is 41.9 mN·m or less,
the viscosity $\eta$ of the ink is more than 2.4 mPa·s and is 35.0 mPa·s or less, and
the diameter r of the ink ejection nozzle is 0.02 mm or more and is 0.03 mm or less.

11. An ink that is ejected onto a substrate by an inkjet device having an ink ejection nozzle, and is dried to form a functional layer, comprising:
functional material as a material for the functional layer, the functional material having a weight-average molecular weight greater than zero and equal to or less than 100,000; and
a solvent dissolving the functional material, wherein
when a value Z denotes a reciprocal of the Ohnesorge number Oh determined by density $\rho$ (g/m$^3$), surface tension $\gamma$ (mN·m), and viscosity $\eta$ (mPa·s) of the ink and a diameter r (mm) of the ink ejection nozzle, the value Z is within a range of Formula 1,
speed V (m/s) at which the ink is ejected is within a range of Formula 2, and
the value Z and the speed V (m/s) satisfy Formula 3:

$$0.7 \leq Z \leq 13$$

where $Z = 1/\text{Ohnesorge number } Oh = (r \cdot \rho \cdot \gamma)^{1/2}/\eta$ (Formula 1);

$$3 \leq V \leq 6$$ (Formula 2); and $$V \leq -2.17 \, \text{Ln}(Z) + 8.47$$ (Formula 3).

12. The ink of claim 11,
including the solvent and the functional material as a material for the functional layer of an organic light-emitting element; and
being ejected onto a base layer of the substrate for the organic light-emitting element and dried to form the functional layer between a first electrode included in the base layer and a second electrode opposing the base layer.

13. The ink of claim 11, wherein
when the speed V is 3 m/s or more and is 5 m/s or less, the value Z, which is determined by the density $\rho$ (g/m$^3$), the surface tension $\gamma$ (mN·m), and the viscosity $\eta$ (mPa·s) of the ink, is two or more and is ten or less.

14. The ink of claim 11, wherein
when the diameter r of the ink ejection nozzle is 0.02 mm or more and is 0.03 mm or less
the density $\rho$ of the ink is more than 827 g/m$^3$ and is 1190 g/m$^3$ or less,
the surface tension $\gamma$ of the ink is more than 27.3 mN·m and is 41.9 mN·m or less, and
the viscosity $\eta$ of the ink is more than 2.4 mPa·s and is 35.0 mPa·s or less.

15. A substrate having the functional layer manufactured by using the ink of claim 11.

16. The organic light-emitting element having the functional layer manufactured by using the ink of claim 12.

17. An organic display panel including the organic light-emitting element having the functional layer manufactured by using the ink of claim 12.

18. An organic light-emitting device including the organic light-emitting element having the functional layer manufactured by using the ink of claim 12.

19. An organic display device including the organic light-emitting element having the functional layer manufactured by using the ink of claim 12.

20. An inkjet device that is for containing therein ink including functional material as a material for a functional layer and a solvent dissolving the functional material, and ejects the ink from an ink ejection nozzle onto a substrate to form the functional layer, the functional material having a weight-average molecular weight greater than zero and equal to or less than 100,000, wherein when a value Z denotes a reciprocal of the Ohnesorge number Oh determined by density $\rho$ (g/m$^3$), surface tension $\gamma$ (mN·m), and viscosity $\eta$ (mPa·s) of the ink and a diameter r (mm) of the ink ejection nozzle, the value Z is within a range of Formula 1, speed V (m/s) at which the ink is ejected is within a range of Formula 2, and the value Z and the speed V (m/s) satisfy Formula 3:

$$0.7 \leq Z \leq 13$$

where $Z = 1/\text{Ohnesorge number } Oh = (r \cdot \rho \cdot \gamma)^{1/2}/\eta$ (Formula 1);

$$3 \leq V \leq 6$$ (Formula 2); and $$V \leq -2.17 \, \text{Ln}(Z) + 8.47$$ (Formula 3).

21. The inkjet device of claim 20, wherein the functional material included in the ink is a material for the functional layer of an organic light-emitting element, and the ink is ejected onto a base layer of the substrate for the organic light-emitting element to form the functional layer between a first electrode included in the base layer and a second electrode opposing the base layer.

22. A substrate having the functional layer manufactured by using the inkjet device of claim 20.

23. The organic light-emitting element having the functional layer manufactured by using the inkjet device of claim 21.

24. An organic display panel including the organic light-emitting element having the functional layer manufactured by using the inkjet device of claim 21.

25. An organic light-emitting device including the organic light-emitting element having the functional layer manufactured by using the inkjet device of claim 21.

26. An organic display device including the organic light-emitting element having the functional layer manufactured by using the inkjet device of claim 21.

* * * * *